(12) United States Patent
Kuranouchi

(10) Patent No.: US 11,211,966 B2
(45) Date of Patent: Dec. 28, 2021

(54) SEMICONDUCTOR DEVICE, ANTENNA SWITCH CIRCUIT, MODULE DEVICE, AND WIRELESS COMMUNICATION DEVICE

(71) Applicant: SONY CORPORATION, Tokyo (JP)

(72) Inventor: Atsushi Kuranouchi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 676 days.

(21) Appl. No.: 16/078,136

(22) PCT Filed: Jan. 17, 2017

(86) PCT No.: PCT/JP2017/001365
§ 371 (c)(1),
(2) Date: Aug. 21, 2018

(87) PCT Pub. No.: WO2017/145576
PCT Pub. Date: Aug. 31, 2017

(65) Prior Publication Data
US 2021/0194532 A1 Jun. 24, 2021

(30) Foreign Application Priority Data
Feb. 24, 2016 (JP) .............................. JP2016-033063

(51) Int. Cl.
*H04B 1/48* (2006.01)
*H01L 27/105* (2006.01)
*H01L 27/12* (2006.01)

(52) U.S. Cl.
CPC ........... *H04B 1/48* (2013.01); *H01L 27/1203* (2013.01)

(58) Field of Classification Search
CPC .......... H04B 1/04; H04B 1/005; H04B 1/006; H04B 1/0475; H04B 1/0483; H04B 1/38; H04B 1/3827; H04B 1/40; H04B 1/44; H04B 1/48; H04B 1/401; H04B 1/525; H04B 7/24; H04B 10/40; H04L 5/14; H04L 5/1461; H04L 27/0002; H01L 2914/1304;
(Continued)

(56) References Cited

U.S. PATENT DOCUMENTS 7,400,863 B2 * 7/2008 Kobayashi ............ H03F 1/0277
455/73
8,170,500 B2 * 5/2012 Seshita .................... H04B 1/48
455/78
(Continued)

FOREIGN PATENT DOCUMENTS

| JP | 2005-236691 | 9/2005 |
|---|---|---|
| JP | 2011-249466 | 12/2011 |
| WO | WO 2012/098863 | 7/2012 |

OTHER PUBLICATIONS

International Search Report prepared by the Japan Patent Office dated Apr. 4, 2017, for International Application No. PCT/JP2017/001365.

*Primary Examiner* — Quochien B Vuong
(74) *Attorney, Agent, or Firm* — Sheridan Ross P.C.

(57) ABSTRACT

To realize multiple band support in wireless communication in a more favorable manner. A semiconductor device including: a plurality of terminals; and a plurality of transistor groups provided for each of the terminals, in which a plurality of transistors are connected in series in each group. The plurality of transistor groups have different ON-resistances from each other and receive inputs of signals having different power levels from each other.

20 Claims, 12 Drawing Sheets

(58) Field of Classification Search
CPC ... H01L 2914/1306; H01L 2924/13091; H01L 2924/14; H01L 2924/1421; H01L 27/105; H01L 27/1203; H01L 27/1211; H01L 27/04

See application file for complete search history.

(56) References Cited

U.S. PATENT DOCUMENTS

| | | | | |
|---|---|---|---|---|
| 8,306,481 | B2* | 11/2012 | Ilkov | H03K 17/693 |
| | | | | 455/78 |
| 9,124,353 | B2* | 9/2015 | Kang | H03K 17/687 |
| 10,056,935 | B2* | 8/2018 | Lee | H04B 1/44 |
| 10,256,794 | B2* | 4/2019 | Srirattana | H04B 1/48 |
| 10,854,944 | B2* | 12/2020 | Jeon | H04B 1/006 |
| 2005/0186919 | A1 | 8/2005 | Kobayashi et al. | |
| 2011/0294445 | A1 | 12/2011 | Goto et al. | |
| 2013/0285749 | A1 | 10/2013 | Kamitani et al. | |

* cited by examiner

SEMICONDUCTOR DEVICE, ANTENNA SWITCH CIRCUIT, MODULE DEVICE, AND WIRELESS COMMUNICATION DEVICE

CROSS REFERENCE TO RELATED APPLICATIONS

This application is a national stage application under 35 U.S.C. 371 and claims the benefit of PCT Application No. PCT/JP2017/001365 having an international filing date of 17 Jan. 2017, which designated the United States, which PCT application claimed the benefit of Japanese Patent Application No. 2016-033063 filed 24 Feb. 2016, the entire disclosures of each of which are incorporated herein by reference.

TECHNICAL FIELD

The present disclosure relates to a semiconductor device, an antenna switch circuit, a module device, and a wireless communication device.

BACKGROUND ART

As communication technologies have evolved in recent years, not only a so-called 800 MHz band (which will also be referred to as a "low frequency band" below) but also higher frequency bands such as a 1.5. GHz band, a 2.0 GHz band, and the like (which will also be referred to as a "high frequency band" below) have become available as frequency bands to be used in wireless communication. In such a situation, there are cases in which wireless communication devices that are capable of performing wireless communication such as smartphones need to deal with transmission and reception of signals of a plurality of different frequency bands. For this reason, there are cases with respect to such wireless communication devices in which antenna switch circuits are provided in order to share one antenna in transmission and reception of a plurality of signals of different frequency bands.

As a configuration of an antenna switch circuit, for example, a combination of a conduction state (an ON state) in which desired signals are passed through and a transistor (e.g., a field effect transistor or FET) in a shutdown state (an OFF state) in which unnecessary signals are blocked is exemplified. For example, Patent Literature 1 discloses an example of an antenna switch circuit.

CITATION LIST

Patent Literature

Patent Literature 1: JP 2011-249466A

DISCLOSURE OF INVENTION

Technical Problem

In addition, the technology known as Carrier Aggregation (CA) that improves communication throughput by forming a communication channel by integrating a plurality of frequency bands has also been put to practical use in recent years. As technologies including such CA have been put to practical use, the number of communication bands to be used in wireless communication has tended to increase accordingly. Thus, antenna switch circuits are also required to support more frequency bands (i.e., multiple band support), and without being limited to Single Pole Double Throw (SPDT) that is a minimum configuration, for example, a configuration of SP8T or SP10T has also been required recently.

Meanwhile, there are cases in which characteristics necessary for an antenna switch circuit such as a so-called ON-resistance, OFF-capacitance, and withstand voltage vary in accordance with frequencies of signals to be passed through. For this reason, compatibility between multiple band support and realization of more favorable characteristics of each band is required.

Therefore, the present disclosure proposes a semiconductor device, an antenna switch circuit, a module device, and a wireless communication device that can realize multiple band support in wireless communication in a more favorable manner.

Solution to Problem

According to the present disclosure, there is provided a semiconductor device including: a plurality of terminals; and a plurality of transistor groups provided for each of the terminals, in which a plurality of transistors are connected in series in each group. The plurality of transistor groups have different ON-resistances from each other and receive inputs of signals having different power levels from each other.

In addition, according to the present disclosure, an antenna switch circuit which includes an antenna terminal connected to an antenna, a plurality of transmission/reception terminals which are different from the antenna terminal, a switching part which selectively switches a connection relation between the antenna terminal and each of the plurality of transmission/reception terminals, and a plurality of transistor groups provided for each of the transmission/reception terminals, in which a plurality of transistors are connected in series in each group, and in which the plurality of transistor groups have different ON-resistances from each other and receive inputs of signals having different power levels from each other is provided.

In addition, according to the present disclosure, there is provided a module device including: an antenna switch circuit that includes an antenna terminal configured to be connected to an antenna and a plurality of transmission/reception terminals which are different from the antenna terminal, and is configured to selectively switch a connection relation between the antenna terminal and each of the plurality of transmission/reception ends; and a duplexer configured to be connected to each of the plurality of transmission/reception terminals and demultiplex a transmission signal input to the transmission/reception terminal and a reception signal output from the transmission/reception terminal. The antenna switch circuit includes a plurality of transistor groups which are provided for each of the transmission/reception terminals, in which a plurality of transistors are connected in series in each group, and the plurality of transistor groups have different ON-resistances from each other and receive inputs of signals having different power levels from each other.

In addition, according to the present disclosure, there is provided a wireless communication device including: an antenna; and a front-end module configured to selectively switch an input of a transmission signal to the antenna and an output of a reception signal received by the antenna for each frequency. The front-end module includes an antenna switch circuit that includes an antenna terminal configured to be connected to the antenna and a plurality of transmission/reception terminals which are different from the antenna terminal, and is configured to selectively switch a connection relation between the antenna terminal and each of the plurality of transmission/reception ends, and a duplexer configured to be connected to each of the plurality of transmission/reception terminals and demultiplex the transmission signal input to the transmission/reception terminal and the reception signal output from the transmission/reception terminal, the antenna switch circuit includes a plurality of transistor groups which are provided for each of the transmission/reception terminals, in which a plurality of transistors are connected in series in each group, and the plurality of transistor groups have different ON-resistances from each other and receive inputs of signals having different power levels from each other.

Advantageous Effects of Invention

According to the present disclosure described above, a semiconductor device, an antenna switch circuit, a module device, and a wireless communication device that can realize multiple band support in wireless communication in a more favorable manner can be provided.

Note that the effects described above are not necessarily imitative. With or in the place of the above effects, there may be achieved any one of the effects described in this specification or other effects that may be grasped from this specification.

MODE(S) FOR CARRYING OUT THE INVENTION

Figure 1:
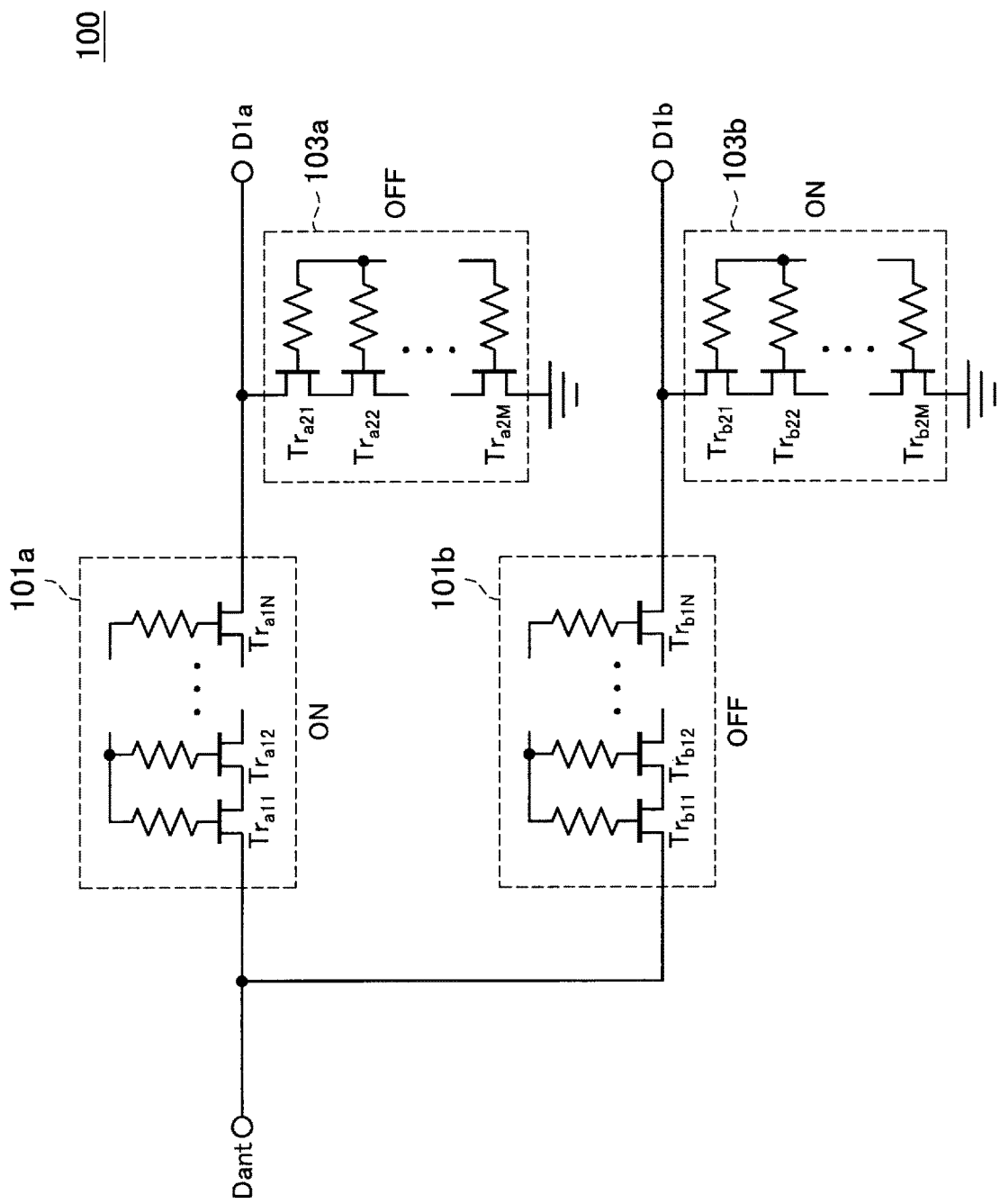
FIG. 1 is an explanatory diagram for describing an example of a schematic circuit configuration of an antenna switch circuit.

Hereinafter, (a) preferred embodiment (s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that description will be provided in the following order.
1. Introduction
1.1. Configuration of antenna switch circuit
1.2. Study on antenna switch circuit
2. Technical features
2.1. Overview
2.2. Configuration of semiconductor element
2.3. Implementation example
2.4. Application example
3. Conclusion
<<1. Introduction>>
<1.1. Configuration of Antenna Switch Circuit>

First, an example of a configuration of an antenna switch circuit for sharing transmission and reception of a plurality of signals of different frequency bands with one antenna will be described with reference to FIG. 1. FIG. 1 is an explanatory diagram for describing an example of a schematic circuit configuration of an antenna switch circuit, illustrating the example of the antenna switch circuit having an SPDT configuration for sharing transmission and reception of two signals of different frequency bands with one antenna.

As illustrated in FIG. 1, the antenna switch circuit 100 has an antenna terminal Dant and transmission/reception terminals D1a and D1b. In addition, the antenna switch circuit 100 has a series part 101a between the antenna terminal Dant and the transmission/reception terminal D1a, and a shunt part 103a between the transmission/reception terminal D1a and a reference potential (which will also be referred to as a "GND terminal" below). The series part 101a is configured by a transistor group in which a plurality of transistors $Tr_{a11}$ to $Tr_{a1N}$ are connected in series. In addition, the shunt part 103a is configured by a transistor group in which a plurality of transistors $Tr_{a21}$ to $Tr_{a2M}$ are connected in series. Likewise, the antenna switch circuit 100 has a series part 101b between the antenna terminal Dant and the transmission/reception terminal D1b, and a shunt part 103b between the transmission/reception terminal D1b and a GND terminal. The series part 101b and the shunt part 103b are configured by transistor groups in which a plurality of transistors are connected in series as in the series part 101a and the shunt part 103a.

In a case in which each of the series parts 101a and 101b and the shunt parts 103a and 103b is in a conduction state, each transistor receives a boost voltage 6 V) as a gate voltage and an installation voltage (e.g., 0 V) as a back gate voltage. In addition, in a case of a shutdown state (i.e., NON-conduction state), each transistor receives a step-down voltage (e.g., −5 V) as each of a gate voltage and a back gate voltage. Note that the series parts 101a and 101b may be referred to simply as "series parts 101" in description below unless they are particularly distinguished. Likewise, the shunt parts 103a and 103b may be referred to simply as "shunt parts 103" in description below unless they are particularly distinguished.

In the case in which control is performed to set from the antenna terminal Dant to the transmission/reception terminal D1a to be in a conduction state, for example, the antenna switch circuit 100 is controlled such that from the antenna terminal Dant to the transmission/reception terminal D1b are in a shutdown state. In this case, control is performed to set the series part 101a to be in the conduction state and the shunt part 103a to be in the shutdown state. In addition, at this time, control is performed to set the series part 101b to be in the shutdown state and the shunt part 103b to be in the conduction state.

In addition, in a case in which control is performed such that from the antenna terminal Dant to the transmission/reception terminal D1b are in a conduction state, the antenna switch circuit 100 is controlled such that from the antenna terminal Dant to the transmission/reception terminal D1a are in a shutdown state. In this case, control is performed to set the series part 101b to be in the conduction state and the shunt part 103b to be in the shutdown state. In addition, at this time, control is performed to set the series part 101a to be in the shutdown state and the shunt part 103a to be in the conduction state.

With the above-described configuration, signals of different frequency bands are input to and output from, for example, each of the transmission/reception terminals D1a and D1b of the antenna switch circuit 100. As a more specific example, a signal of a high frequency band is input to and output from the transmission/reception terminal D1a, and a signal of a low frequency band is input to and output from the transmission/reception terminal D1b. In other words, in a case in which a signal of a high frequency band is transmitted or received via the antenna, control is performed such that from the antenna terminal Dant to the transmission/reception terminal D1a (i.e., the series part 101a) are in a conduction state and from the antenna terminal Dant to the transmission/reception terminal D1b (i.e., the series part 101b) are in a shutdown state. In addition, in a case in which a signal of a low frequency band is transmitted or received via the antenna, control is performed such that from the antenna terminal Dant to the transmission/reception terminal D1b (i.e., the series part 101b) are in a conduction state and from the antenna terminal Dant to the transmission/reception terminal D1a (i.e., the series part 101a) are in a shutdown state.

Note that, although the SPDT configuration in which the two transmission/reception terminals D1a and D1b are selectively connected to the one antenna terminal Dant has been described as an example of a configuration of the antenna switch circuit in the above description, a configuration is not necessarily limited only to the above. For example, it may be configured such that three or more transmission/reception terminals can be selectively connected to the one antenna terminal Dant. As more specific examples, SP8T in which 8 transmission/reception terminals can be selectively connected to the one antenna terminal Dant, SP10T in which 10 transmission/reception terminals can be selectively connected thereto, and the like are exemplified.

Figure 2:
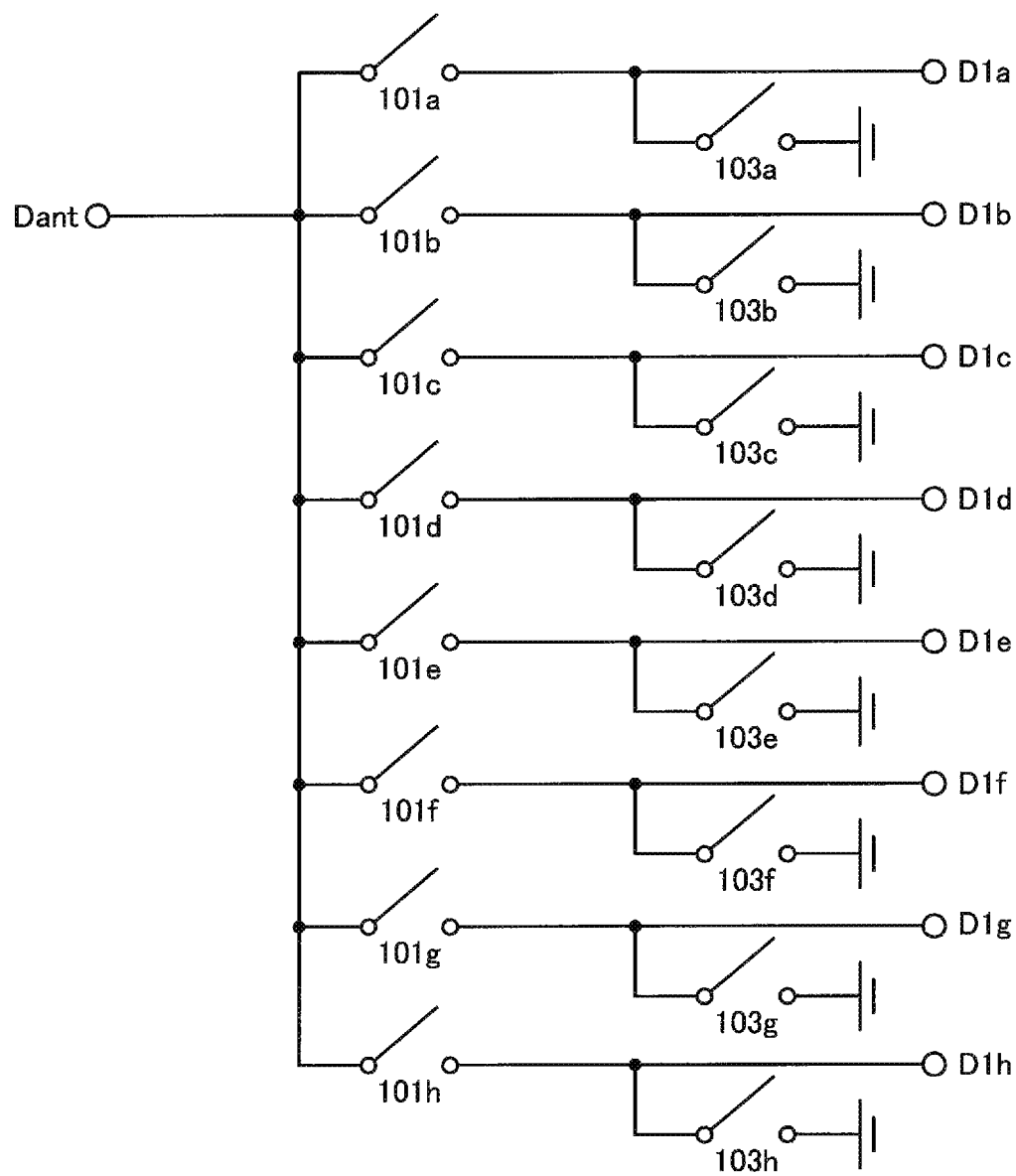
FIG. 2 is an explanatory diagram for describing another example of the configuration of the antenna switch circuit.

For example, FIG. 2 is an explanatory diagram for describing another example of the configuration of the antenna switch circuit, illustrating an example of an antenna switch circuit having the SP8T configuration.

That is, as illustrated in FIG. 2, an antenna switch circuit 100' of the SP8T configuration has the antenna terminal Dant and 8 transmission/reception terminals D1a to D1h. In addition, series parts 101 (i.e., series parts 101a to 101h) intervene between the antenna terminal Dant and each of the transmission/reception terminals D1a to D1h, and shunt parts 103 (i.e., shunt parts 103a to 101h) intervene between each of the transmission/reception terminals D1a to D1h and GND terminals.

With the above-described configuration, signals of different frequencies are input to and output from, for example, each of the transmission/reception terminals D1a to D1h of the antenna switch circuit 100'. In addition, in a case in which any one of the transmission/reception terminals D1a to D1h is connected to the antenna terminal Dant, connection states of the series parts 101a to 101h and the shunt parts 103a to 103h are controlled such that the other transmission/reception terminals are disconnected from the antenna terminal Dant.

More specifically, in a case in which control is performed such that from the antenna terminal Dant to the transmission/reception terminal D1a (i.e., the series part 101a) are in a conduction state, control is performed such that from the antenna terminal Dant to each of the transmission/reception terminals D1b to D1h (i.e., the series parts 101b to 101h) are in a shutdown state. That is, in that case, a signal input to or output from the transmission/reception terminal D1a is transmitted or received via the antenna.

The examples of the configurations of the antenna switch circuits for sharing transmission and reception of a plurality of signals of different frequency bands with one antenna have been described above with reference to FIGS. 1 and 2.

<1.2. Study on Antenna Switch Circuit>

Next, characteristics of an antenna switch circuit will be described and then an objective of an antenna switch circuit according to the present embodiment will be discussed with reference to FIGS. 3 and 4.

As characteristics of antenna switches, "insertion loss," "isolation," "harmonics, IIP3, and IMD," and the like are exemplified. "Insertion loss" represents a characteristic of causing a signal from an antenna or a power amplifier (PA) to pass with slight loss. In addition, "isolation" represents a characteristic of suppressing leakage of a signal to a peripheral circuit. In addition, "harmonics, IIP3, and IMD" represent characteristics of suppressing emission of unnecessary radio waves (i.e., reducing distortion).

As a technique for improving "insertion loss" and "isolation," a reduction in the product of a resistance of transistors (the series parts in FIG. 1) in an ON state (ON-resistance Ron) and a capacitance of transistors in an OFF state (an OFF-capacitance Coff) (Ron*Coff) is exemplified. In addition, as a technique for improving "harmonics, IIP3, and IMD," improving nonlinearity (voltage dependence) of a junction capacitance or a diffusion layer resistance of a transistor is exemplified.

In addition, there are cases in which an antenna switch tends to have a high input voltage and a withstand voltage (i.e., a withstand voltage) is difficult to secure with a single transistor. Thus, there are cases in which the series parts 101 and the shunt parts 103 described with reference to FIG. 1 secure a withstand voltage by connecting (stacking) a plurality of transistors (e.g., FETs) in series in multiple stages. Note that the ON-resistance Ron and the OFF-capacitance Coff depend on, for example, the number of stages of transistors connected in multiple stages as the series parts 101.

Here, "insertion loss" will be described in more detail with reference to FIG. 3. FIG. 3 is an explanatory diagram for describing "insertion loss," illustrating an example of an equivalent circuit expressing a configuration of a simplest switch circuit with an ON-resistance Ron of a series part 101 and an OFF-capacitance Coff of a shunt part 103. Note that loss of the circuit illustrated in FIG. 3 (i.e., "insertion loss") is expressed by (Formula 1) as below. Note that, in (Formula 1) below, Pin denotes input power and Pout denotes output power.

[Math. 1]

$$\text{Loss} = 10\log\frac{Pout}{Pin} \quad \text{(Formula 1)}$$

Figure 3:
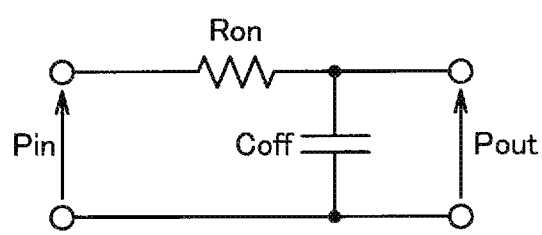
FIG. 3 illustrates an example of an equivalent circuit to the antenna switch circuit.
Figure 4:
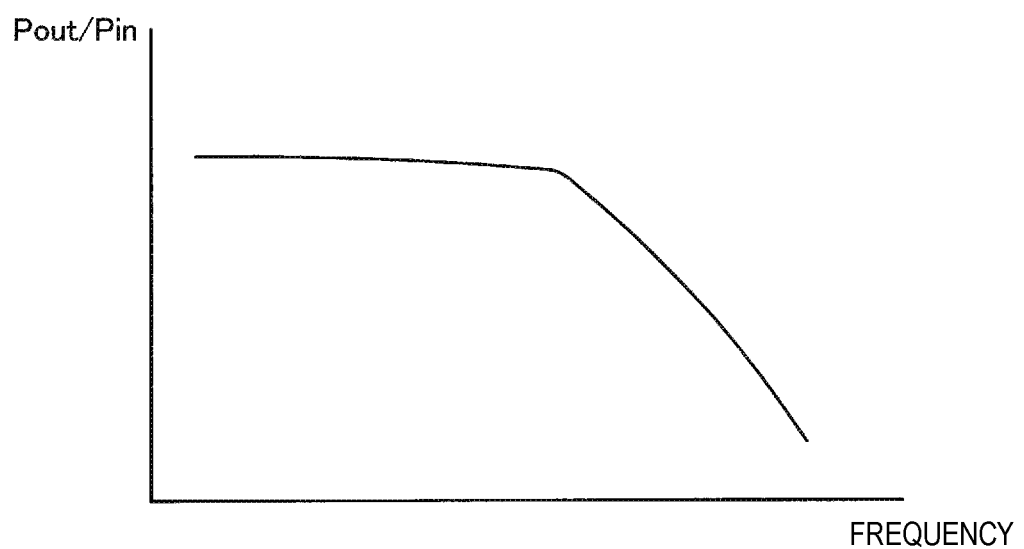
FIG. 4 illustrates an example of a frequency characteristic with respect to input and output of the equivalent circuit illustrated in FIG. 3.

In addition, FIG. 4 illustrates an example of a frequency characteristic of input power Pin and output power Pout in the equivalent circuit illustrated in FIG. 3. In FIG. 4, the vertical axis represents a ratio Pout/Pin of input Pin and output Pout, and the horizontal axis represents frequency. As is obvious referring to FIGS. 3 and 4, the ON-resistance Ron has greater influence in low frequency bands. On the other hand, the influence of the OFF-capacitance Coff is more dominant in high frequency bands.

Here, the antenna switch circuit 100 illustrated in FIG. 1 will be focused on. In a case in which the antenna switch circuit 100 illustrated in FIG. 1 is controlled such that a system (e.g., the series part 101a) connected to the transmission/reception terminal D1a is set to be in a conduction state (ON-state), another system (e.g., the series part 101b) connected to the transmission/reception terminal D1b is in a shutdown state (OFF-state). Here, the ON-resistance Ron of the transistors connected in multiple stages is a series resistance, and the OFF-capacitance Coff is a series capacitance. Thus, for example, in a case in which the number of transistors connected in multiple stages (which will also be referred to as "the number of stacked transistors" below) is desired to increase in order to secure a withstand voltage of the series parts 101, the ON-resistance Ron becomes larger and the OFF-capacitance Coff becomes smaller. Although the ON-resistance Ron can be reduced by enlarging a gate width Wg of each transistor, in that case, the OFF-capacitance Coff becomes larger and a chip size of the antenna switch circuit 100 increases as well.

In addition, the technology known as Carrier Aggregation (CA) that improves communication throughput by forming a communication channel by integrating a plurality of frequency bands has also been put to practical use in recent years. Thus, like the above-described SP8T and SP10T, antenna switch circuits that enable one antenna to be shared in transmission and reception of signals of more frequency bands than in the SPDT configuration have also been proposed.

Here, the characteristics described with reference to FIGS. 3 and 4 will be focused on again. As described above, the ON-resistance Ron has greater influence in a low frequency band and the OFF-capacitance Coff has more dominant influence in a high frequency band. For this reason, in an antenna switch circuit used in transmission and reception of signals of high frequency bands (which will also be referred to as a "high-band antenna switch circuit" below), for example, a reduction of the OFF-capacitance Coff on the path controlled to the shutdown state and a reduction of the ON-resistance Ron on the path controlled to the conduction state are required to improve the characteristics further. Specifically, the OFF-capacitance Coff can be reduced by, for example, increasing the number of stacked transistors constituting the series parts 101. In addition, the ON-resistance Ron can be reduced by, for example, further enlarging the gate widths Wg of the transistors constituting the series parts 101. However, there is a possibility of the enlargement of the gate widths Wg leading to enlargement of the chip size, and there are cases in which the enlarged widths are restricted. For those reasons, for example, there are cases in which it is necessary to reduce the ON-resistance Ron of the transistors themselves further.

In addition, in an antenna switch circuit used in transmission and reception of signals of low frequency bands (which will also be referred to as a "low-band antenna switch circuit" below), a higher withstand voltage is necessary. Specifically, a higher withstand voltage can be obtained by increasing the number of stacked transistors constituting the series parts 101. Meanwhile, there is a possibility of an increase in the number of stacked transistors leading to enlargement of the chip size. In addition, as the number of stacked transistors increases further, the ON-resistance Ron increases as well. Thus, in order to prevent the number of stacked transistors from excessively increasing, there are also cases in which it is necessary to use high withstand voltage transistors (FETs).

In particular, a reduction of the ON-resistance Ron and an increase in a withstand voltage tend to be in a trade-off relation, and with respect to an antenna switch circuit required to support multiple bands, it is necessary to develop a device based on the above-described characteristics in respective low frequency bands and high frequency bands. Therefore, the present disclosure proposes an antenna switch circuit that can support multiple bands and realize transmission and reception of signals of each frequency band in a more favorable manner (with favorable characteristics) and various devices to which the antenna switch circuit is applied.

<<2. Technical Features>>

Technical features of an antenna switch circuit according to an embodiment of the present disclosure will be described below <2.1. Overview>

First, an overview of technical features of the antenna switch circuit according to the present embodiment will be described. In the antenna switch circuit 100 according to the present embodiment, each of the series parts 101 connected to respective transmission/reception terminals (i.e., a transistor group connected in series) receives inputs of signals having different power levels in accordance with frequencies of the signals input to and output from the transmission/reception terminals.

Thus, in the antenna switch circuit 100 according to the present embodiment, each of the series parts 101 is configured to have the ON-resistance Ron in accordance with differences of power levels of input signals. More specifically, the series part 101 connected to a transmission/reception terminal that receives an input of or outputs a signal having a higher power level is configured to have a smaller ON-resistance than the series part 101 connected to a transmission/reception terminal that receives an input of or outputs a signal having a lower power level. In addition, the series part 101 connected to the transmission/reception terminal that receives an input of or outputs a signal having a lower power level is configured to have a higher withstand voltage than the series part 101 connected to the transmission/reception terminal that receives an input of or outputs a signal having a higher power level. By realizing this configuration, the antenna switch circuit 100 according to the present embodiment achieves the characteristics necessary in each frequency band including high frequency bands and low frequency bands.

Meanwhile, as described above, there are cases in which a withstand voltage of a device is lowered in a case in which the ON-resistance Ron is reduced further. Thus, for example, it is necessary for a system to which a signal of a high frequency band is input (i.e., "the series part 101 on a high frequency band side") and a system to which a signal of a low frequency band is input (i.e., "the series part 101 on a low frequency band side") to have opposite device characteristics.

Therefore, in the antenna switch circuit 100 according to the present embodiment, characteristics required in each of the series parts 101 are realized by adjusting element parameters of the transistors used in the series parts 101 on each of the high frequency band side and low frequency band side and the number of stacked transistors of each of the series parts 101. Note that, at this time, it is a matter of course that at least some of the element parameters and the number of stacked transistors may be different between the series parts 101 on each of the high frequency band side and low frequency band side. Hereinbelow, a configuration and a technique to realize the above-described configuration of the antenna switch circuit 100 according to the present embodiment will be described in detail.

<2.2. Configuration of Semiconductor Element>

First, examples of configurations of a transistor group constituting the series parts 101 and the shunt parts 103 in the antenna switch circuit 100 according to the present embodiment and a semiconductor element such as a transistor or the like applied to the transistor group will be described with reference to FIGS. 5 and 6.

Figure 5:
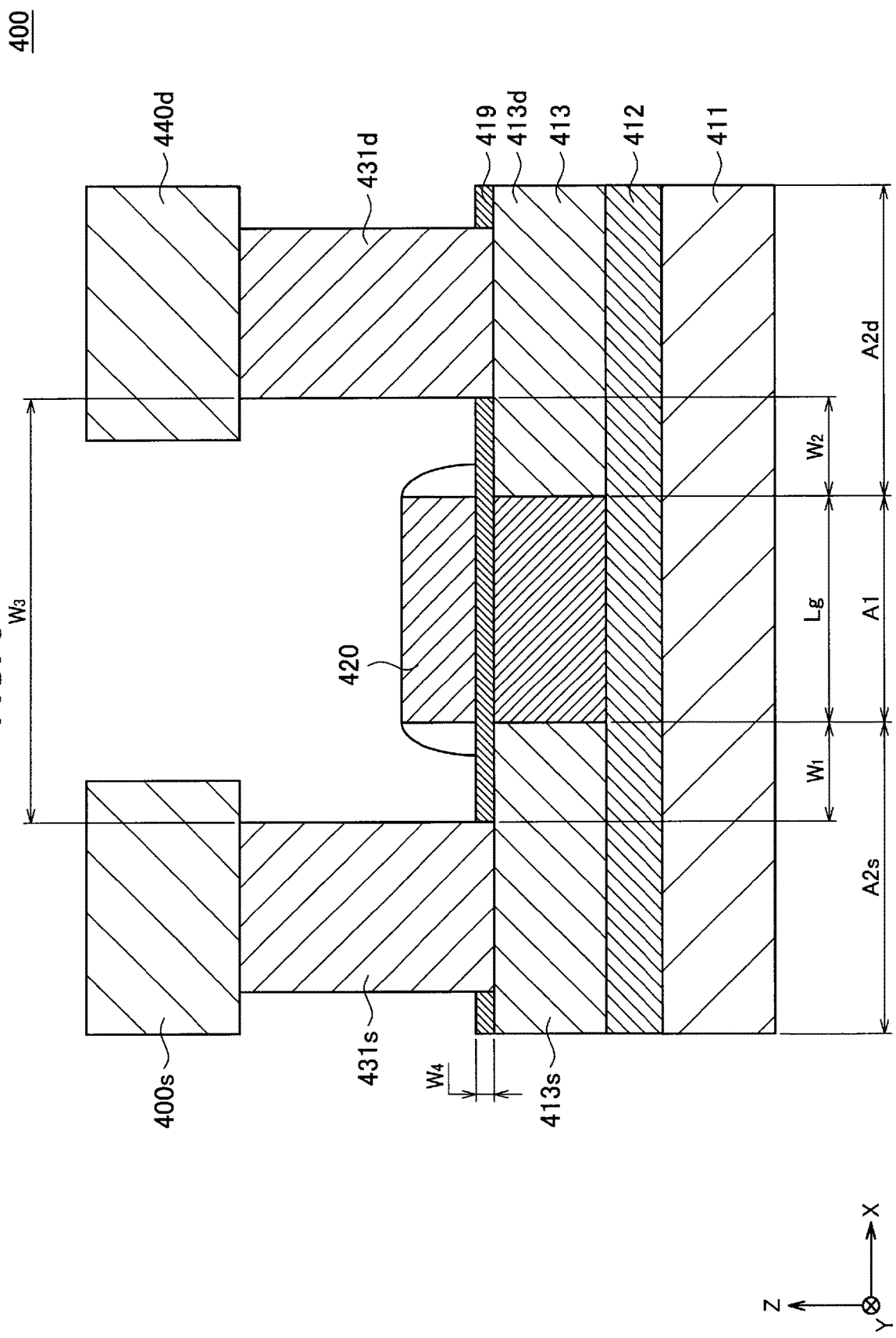
FIG. 5 is an explanatory diagram for describing an example of a schematic configuration of a transistor applied to an antenna switch circuit according to an embodiment of the present disclosure.

FIG. 5 is, for example, an explanatory diagram for describing an example of a schematic configuration of a transistor (FET) applied to the antenna switch circuit according to the present embodiment, illustrating an example in which the transistor is formed on a silicon-on-insulator (SOI) substrate. Note that, in FIG. 5, the horizontal direction, the vertical direction, and the depth direction of the drawing are denoted as an x direction, a z direction, and a y direction, respectively.

As illustrated in FIG. 5, in a transistor 400 according to the present embodiment, an SOI substrate 410 has an embedded oxide layer 412 and a semiconductor layer 413 on a support substrate 411. In addition, a gate electrode 420 is provided over the semiconductor layer 413 via a gate oxide film 419.

As a specific example, the SOI substrate 410 has the embedded oxide layer 412 formed of a silicon oxide film (SiO2) and the semiconductor layer 413 formed of silicon (Si) on the support substrate 411 formed of, for example, a high resistance silicon (Si) substrate. The semiconductor layer 413 has a first region A1 right below the gate electrode 420 and a second region A2 in another area. The second region A2 includes a source region A2s on one side and a drain region A2d on the other side. In addition, the source region A2s and the drain region A2d have a source diffusion layer 413s and a drain diffusion layer 413d that are high concentration diffusion layers through the thickness direction (from an upper surface to a bottom surface) of the source region A2s and the drain region A2d.

In addition, the gate electrode 420 is provided over the semiconductor layer 413 via the gate oxide film 419 formed of a silicon oxide film (SiO2). In addition, a source electrode 440s is electrically connected to the source region A2s via a source-side contact plug 430s. Likewise, a drain electrode 440d is electrically connected to the drain region A2d via a drain-side contact plug 430d. As described above, in the semiconductor device according to the present embodiment, the series parts 101 and shunt parts 103 are configured by connecting the plurality of transistors in series. For this reason, in a case in which the transistor 400 illustrated in FIG. 5 is applied as each of the transistors constituting the series parts 101 and shunt parts 103, each source-side configuration can operate as each drain-side configuration of another transistor connected thereto in series.

Next, an example of a schematic configuration of a transistor group constituting the series parts 101 or the shunt parts 103 will be described with reference to FIG. 6. FIG. 6 is an illustrative diagram for describing the example of the schematic configuration of the transistor group applied to the antenna switch circuit according to the present embodiment. In FIG. 6, the horizontal direction, the vertical direction, and the depth direction of the drawing are denoted as an x direction, a y direction, and a z direction, respectively. Note that, the x direction, y direction, and z direction in FIG. 6 correspond to the x direction, y direction, and z direction in FIG. 5, respectively. That is, the transistor group illustrated in FIG. 6 is configured by, for example, connecting a plurality of transistors 400 illustrated in FIG. 5 in series in the x direction.

Figure 6:
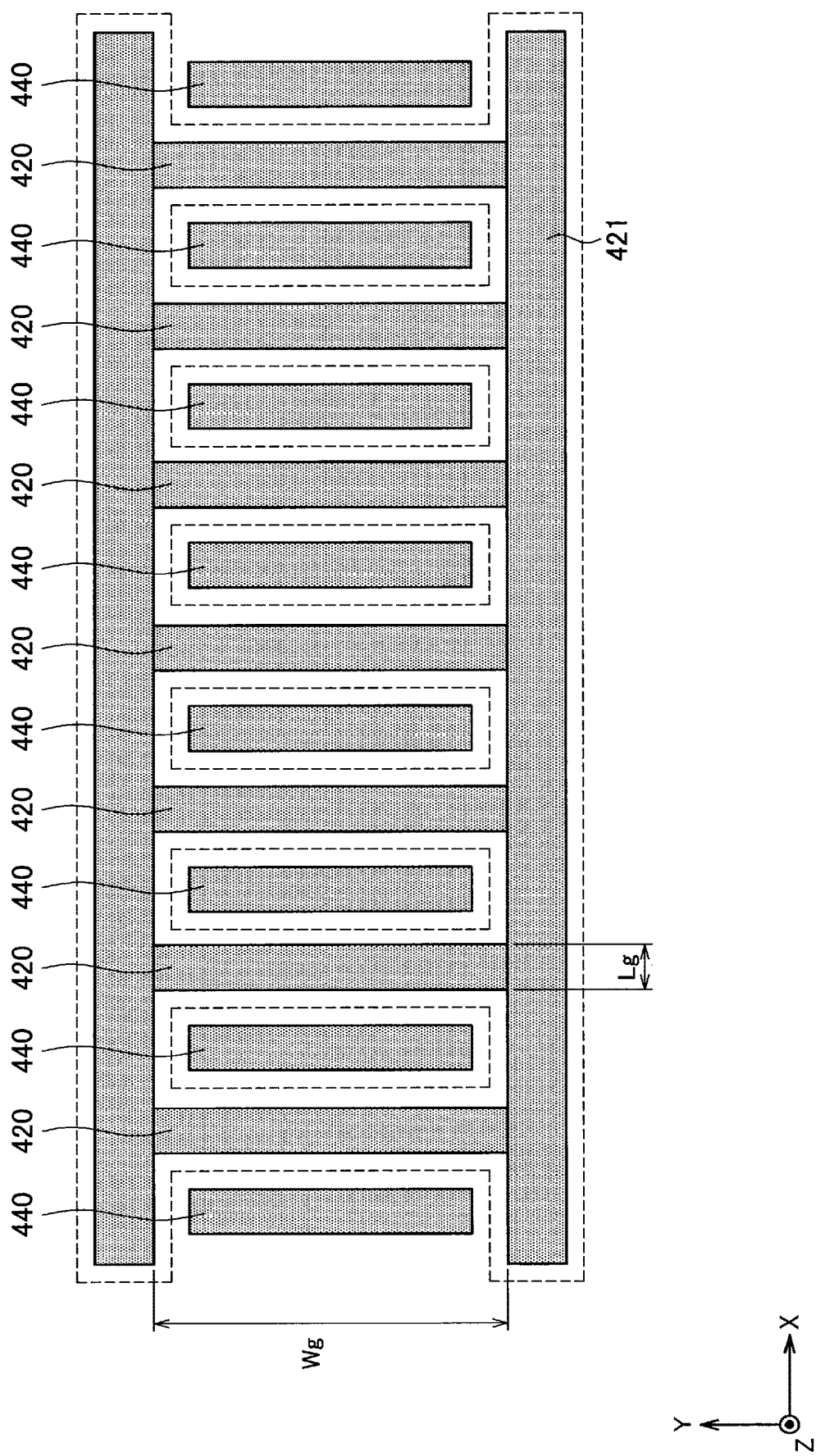
FIG. 6 is an explanatory diagram for describing an example of a schematic configuration of a transistor group applied to the antenna switch circuit according to the embodiment.

In FIG. 6, reference numeral 420 represents a gate electrode of each transistor, corresponding to the gate electrode 420 of the transistor 400 illustrated in FIG. 5. That is, in the example illustrated in FIG. 6, the gate electrodes 420 of respective transistors are disposed in parallel in the x direction. Note that, at that time, the gate electrodes 420 of the respective transistors may be connected by, for example, a connection part 421 as illustrated in FIG. 6. In addition, reference numeral 440 corresponds to a source electrode and a chain electrode (which will also be referred to as "S/D electrodes" below) of each of the transistors connected in series to be adjacent to each other. That is, the S/D electrodes 440 illustrated in FIG. 6 correspond to the source electrode 440s and the drain electrode 440d of the transistor 400 illustrated in FIG. 5.

Here, reference numeral Lg in FIGS. 5 and 6 represents a gate length of each transistor. Reference numeral Wg in FIG. 6 represents a gate width of each transistor. In addition, reference numeral $W_1$ in FIG. 5 represents a physical distance between a source and a gate. Likewise, reference numeral $W_2$ represents a physical distance between the gate and a drain. In addition, reference numeral $W_3$ represents a physical distance between the source and the drain. In addition, reference numeral $W_4$ represents a thickness of the gate oxide film 419. Note that, in FIGS. 5 and 6, the distances of the respective parts represented by the reference numerals Lg, Wg, and W1 to W4 correspond to examples of element parameters of each transistor constituting the series parts 101 and the shunt parts 103 of the antenna switch circuit 100 according to the present embodiment. That is, in the antenna switch circuit 100 according to the present embodiment, characteristics necessary in each of the series part 101 on the high frequency band side and the series part 101 on the low frequency band side are realized by adjusting the element parameters of the transistor constituting each of the series parts 101.

The examples of the configurations of the semiconductor elements such as the transistor group constituting the series parts 101 and the shunt parts 103 and the transistor applied to the transistor group of the antenna switch circuit 100 according to the present embodiment have been described above with reference to FIGS. 5 and 6. Note that the above-described configuration of the semiconductor element is merely an example, and at least a part of the configuration may be appropriately replaced with another configuration as long as a similar function can be realized. As a specific example, a transistor group constituting the series parts 101 and the shunt parts 103, a transistor applied to the transistor group, or the like may be formed on a semi-insulating substrate.

<2.3. Implementation Example>

Next, as an implementation example of the antenna switch circuit 100 according to the present embodiment, an example of a technique for realizing the characteristics necessary for each series part 101 by adjusting the above-described element parameters of a transistor used for each series part 101 will be described. Note that, in the present description, a case in which the gate length Lg of a transistor is adjusted as an element parameter will be focused on to facilitate easier understanding of the characteristics of the present embodiment.

(Relationship Between Gate Length and ON-Resistance and Withstand Voltage)

Figure 7:
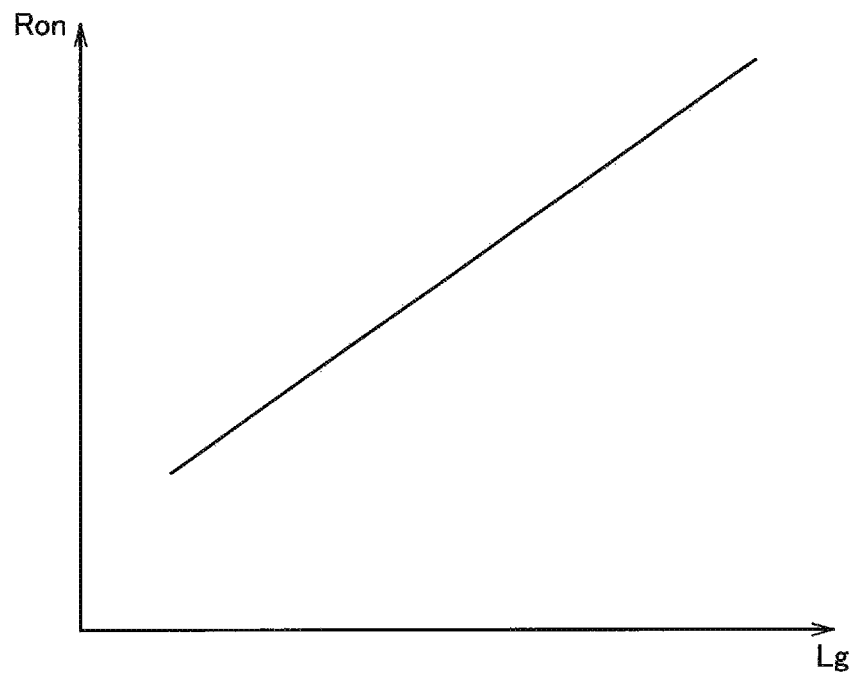
FIG. 7 is an explanatory diagram for describing a relation between a gate length and an ON-resistance.
Figure 8:
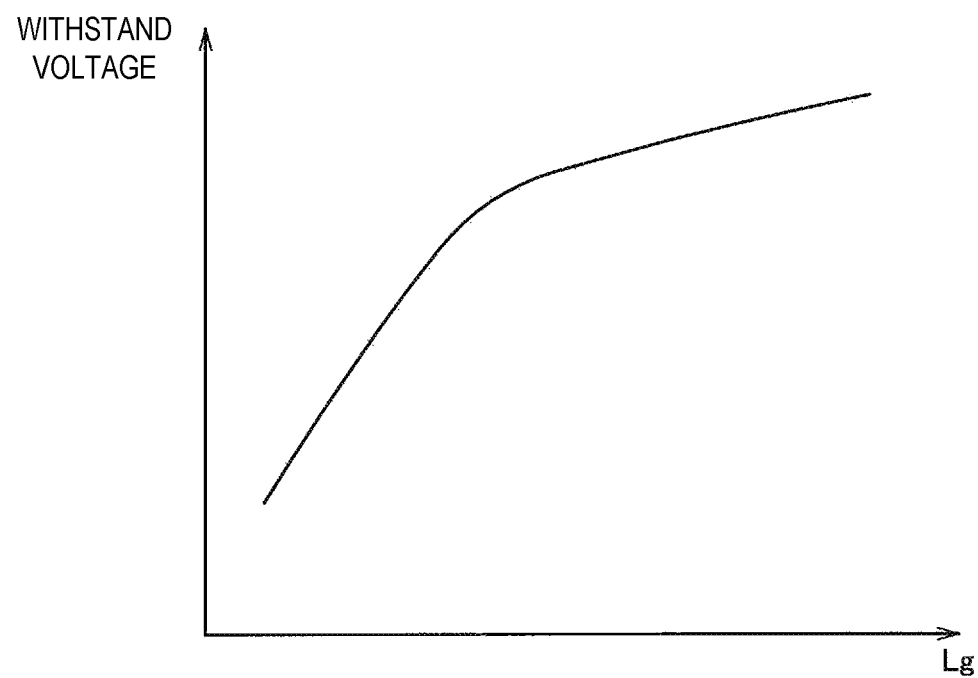
FIG. 8 is an explanatory diagram for describing an example of a relation between a gate length and a withstand voltage.

First, a relation between a gate length Lg of each transistor and an ON-resistance Ron and a withstand voltage will be described respectively with reference to FIGS. 7 and 8. For example, FIG. 7 is an explanatory diagram for describing a relation between a gate length Lg and an ON-resistance Ron. In FIG. 7, the horizontal axis represents the gate length Lg and the vertical axis represents the ON-resistance Ron. As illustrated in FIG. 7, as the gate length Lg of a transistor becomes longer, the ON-resistance Ron of the transistor tends to increase more. In addition, FIG. 8 is an explanatory diagram for describing an example of a relation between a gate length Lg and a withstand voltage. In FIG. 8, the horizontal axis represents the gate length Lg and the vertical axis represents the withstand voltage. As illustrated in FIG. 8, as the gate length Lg of a transistor becomes longer, the withstand voltage of the transistor tends to be higher.

Implementation Example 1

(Simulation of Change in Characteristic Caused by Adjustment of Gate Length)

Next, as Implementation example 1, an example of a simulation result of a change in a characteristic in a case in which a gate length Lg is adjusted as an element parameter in the antenna switch circuit 100 according to the present embodiment will be described. Note that, in the present simulation, a change of loss of each of the system on the high frequency band side and the system on the low frequency band side in a case in which the gate length Lg of each transistor of the series part 101a on the high frequency band side is adjusted was simulated.

First, a condition of the present simulation will be described. In the present simulation, the antenna switch circuit 100 illustrated in FIG. 1 is a target of the simulation. Note that, in the antenna switch circuit 100 that is a target of the simulation, the system connected to the transmission/reception terminal D1a (e.g., the series part 101a and the shunt 103a) is used in transmission and reception of a signal of a high frequency band as a system on the high frequency band side. In addition, the system connected to the transmission/reception terminal D1b (e.g., the series part 101b and the shunt 103b) is assumed to be used in transmission and reception of a signal of a low frequency band as a system on the low frequency band side.

In addition, in the antenna switch circuit 100 that is a target of the simulation, each of the series parts 101a and 101b is constituted using transistors each having a gate width Wg of 2 mm, and the number of stacked transistors is set to 7. In addition, each of the shunt parts 103a and 103 is constituted using transistors each having a gate width Wg of 1 mm, and the number of stacked transistors is set to 6. Note that, although similar values are set for the number of stacked transistors of the series parts 101 on each of the high frequency band side and the low frequency band side in order to facilitate easier understanding of the characteristics of the present embodiment in the present description, the number of stacked transistors of each of the series parts 101 may not necessarily the same.

In addition, in the present description, the gate length Lg, the ON-resistance Ron, and the OFF-capacitance Coff of the series part 101a of the system on the high frequency band side are expressed by relative values using a case in which the gate length Lg is a predetermined length as a reference state. That is, the ON-resistance Ron and the OFF-capacitance Coff of the system on the high frequency band side in a case of a gate length Lg=1 (relative value) are each set to Ron=1 and Coff=1. Note that the system on the low frequency band side is set to have a similar configuration to the reference state of the system on the high frequency band side. That is, the system on the low frequency band side is set to have Lg=1, Ron=1, and Coff=1.

On the basis of the above-described configuration, a change in loss of each of the system on the high frequency band side and the system on the low frequency band side was simulated for each of a case in which the gate length Lg of the series part 101a of the system on the high frequency band side is set to Lg=1 (i.e., the reference state) and a case of Lg=0.8 (i.e., a case in which the gate length Lg is cut 20% from the reference state). Note that, in a case in which the gate length Lg of the series part 101a in the system on the high frequency band side is set to Lg=0.8, if the ON-resistance Ron and the OFF-capacitance Coff of the system on the high frequency band side are each indicated by relative values, Ron=0.9 and Coff=1.1.

Figure 9:
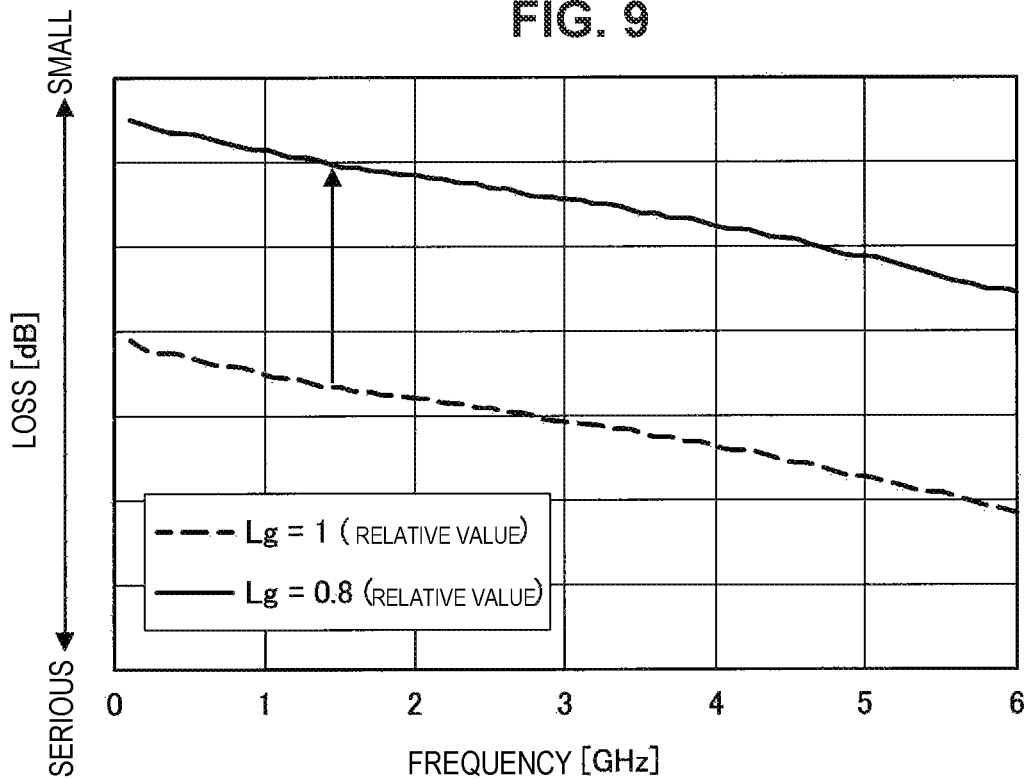
FIG. 9 illustrates an example of a simulation result with respect to a change in loss of a system on a high frequency band side in an antenna switch according to an implementation example of the present disclosure.
Figure 10:
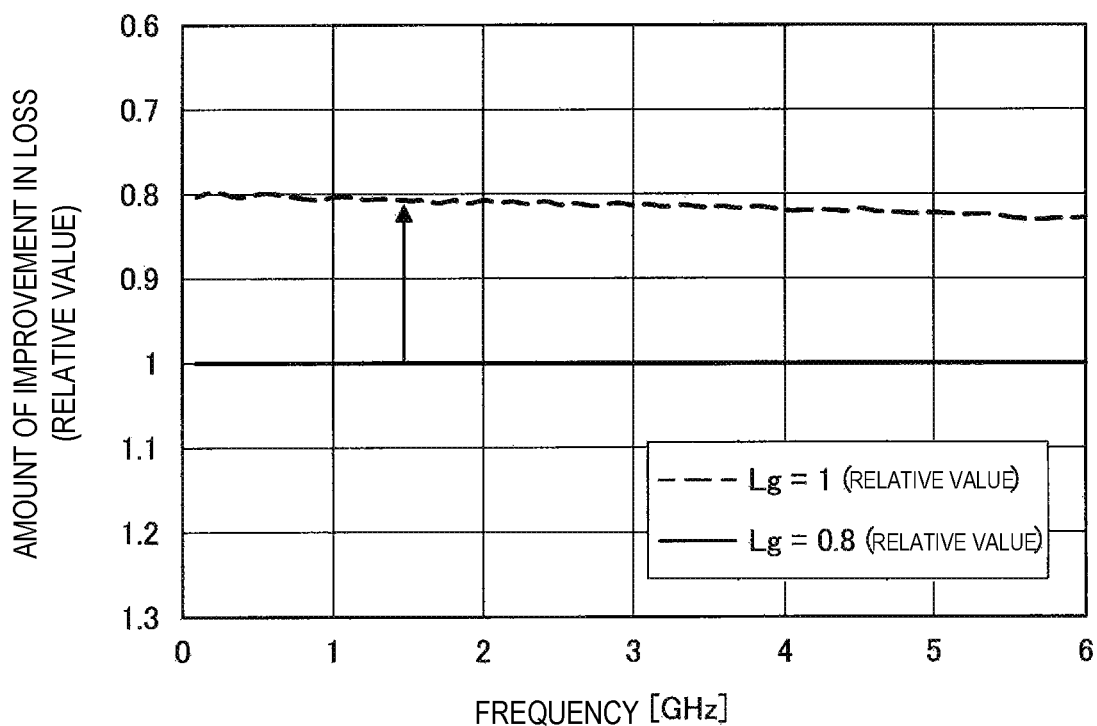
FIG. 10 illustrates an example of a simulation result with respect to a change in loss of a system on a high frequency band side in an antenna switch according to an implementation example of the present disclosure.

For example, FIGS. 9 and 10 illustrate examples of simulation results with respect to changes in loss of the system on the high frequency band side according to an antenna switch according to an implementation example of the present disclosure.

Specifically, FIG. 9 illustrates an example of a simulation result with respect to a change in loss of the system on the high frequency band side in a case in which the gate length Lg of each transistor of the series part 101a in the system on the high frequency band side is adjusted. Note that, in FIG. 9, the horizontal axis represents frequency (GHz) of an input or output signal, and the vertical axis represents loss (dB). In addition, a simulation result of each of a case of Lg=1 and a case of Lg=0.8 is illustrated in FIG. 9. In addition, FIG. 10 is a graph showing amounts of improvement in the loss of the simulation result shown in FIG. 9 expressed by relative values with reference to the case of Lg=1. In FIG. 10, the horizontal axis represents frequency (GHz) of an input or output signal as in FIG. 9. In addition, the vertical axis represents amount of improvement in loss expressed by relative values with reference to the case of Lg=1.

As illustrated in FIG. 9, as a frequency of an input or output signal becomes higher, loss tends to be more serious in the simulation results of both the case of Lg=1 and the case of Lg=0.8. In addition, it is ascertained that loss is smaller in the case of Lg=0.8 than in the case of Lg=1 through the frequencies of the input or output signal. In addition, as is obvious with reference to FIG. 10, it is ascertained that about 20% improvement in loss is expected through the frequencies of the input or output signal by cutting the gate length of each transistor of the series parts 101 in the system on the high frequency band side by 20%.

Next, simulation results of changes in loss of the system on the low frequency band side in a case in which the gate length Lg of each transistor of the series part 101a in the system on the high frequency band side is adjusted will be described. For example, FIGS. 11 and 12 illustrate examples of simulation results of changes in loss of the system on the low frequency band side of an antenna switch according to an implementation example of the present disclosure.

Figure 11:
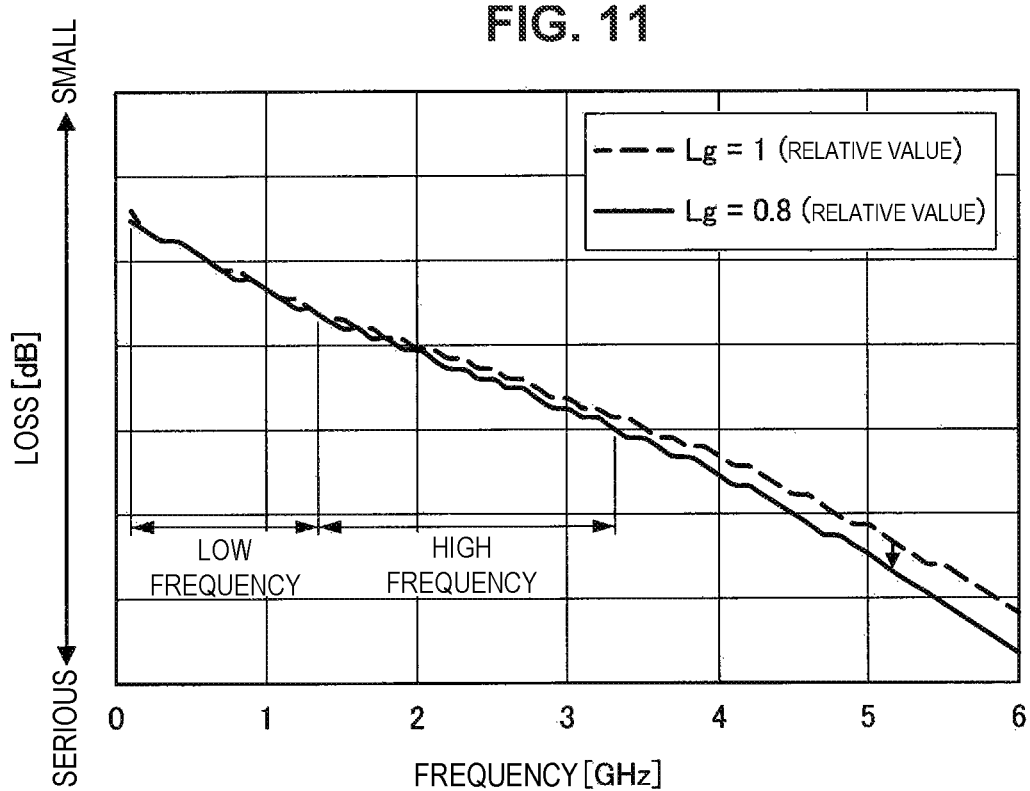
FIG. 11 illustrates an example of a simulation result with respect to a change in loss of a system on a low frequency band side in an antenna switch according to an implementation example of the present disclosure.
Figure 12:
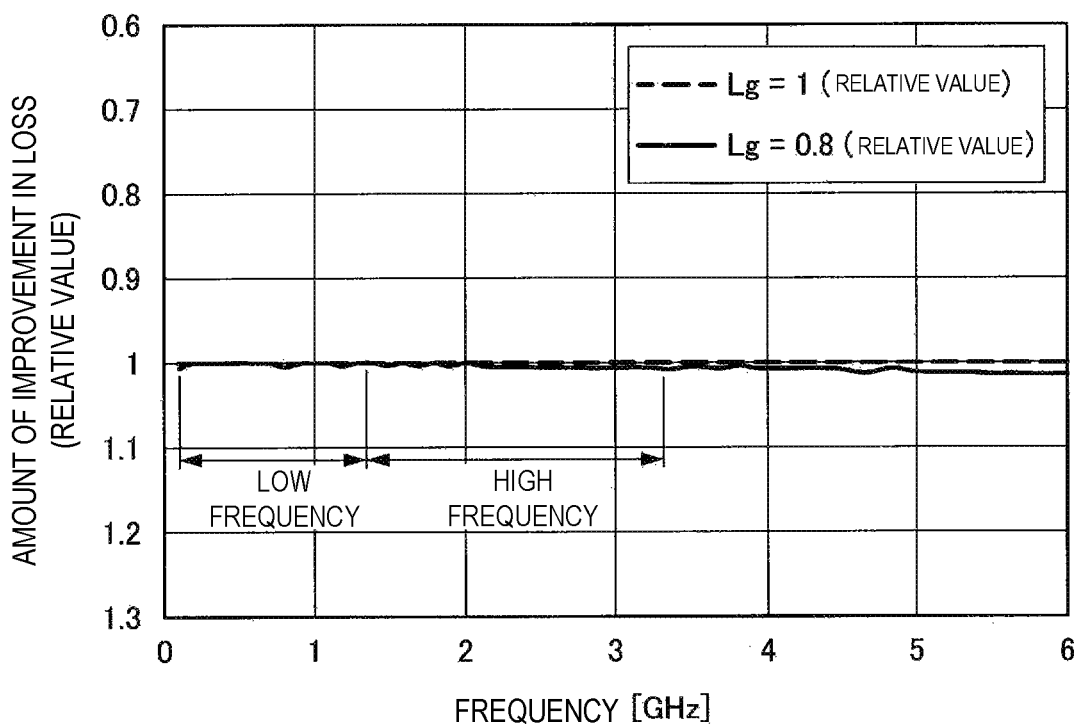
FIG. 12 illustrates an example of a simulation result with respect to a change in loss of a system on a low frequency band side in an antenna switch according to an implementation example of the present disclosure.

Specifically, FIG. 11 illustrates an example of a simulation result with respect to a change in loss of the system on the low frequency band side in a case in which the gate length Lg of each transistor of the series part 101a in the system on the high frequency band side is adjusted. Note that, in FIG. 11, the horizontal axis represents frequency (GHz) of an input or output signal, and the vertical axis represents loss (dB). In addition, simulation results of each of the case of Lg=1 and the case of Lg=0.8 are illustrated in FIG. 11. In addition, FIG. 12 is a graph showing amounts of improvement in the loss of the simulation result shown in FIG. 11 indicated as relative values with reference to the case of Lg=1. In FIG. 12, the horizontal axis represents frequency (GHz) of an input or output signal as in FIG. 11. In addition, the vertical axis represents amount of improvement in loss indicated by relative values with reference to the case of Lg=1.

As illustrated in FIG. 11, in any simulation result of the case of Lg=1 and the case of Lg=0.8, loss tends to be more serious as the frequency of an input or output signal becomes higher. In addition, as is ascertained with reference to FIGS. 11 and 12, loss tends to be more serious (i.e., characteristics deteriorate) further on the high frequency side in the case of Lg=0.8 than in the case of Lg=1 since the foregoing case is affected by an increase of the OFF-capacitance Coff. On the other hand, it is ascertained that the influence of deteriorating characteristics is very small on the low frequency side in the case of Lg=0.8 in comparison to the case of Lg=1.

As illustrated in FIGS. 9 and 10, the loss of the system on the high frequency band side can be reduced more by further shortening the gate length Lg of each transistor constituting the series part 101a of the system on the high frequency band side as described above. In addition, also in that case, it is ascertained that the influence of the deteriorating characteristics is very small on the low frequency side (i.e., a frequency band of a signal that is actually input or output) in the system of the low frequency band side even in a case in which the gate length Lg is further shortened in the system of the high frequency band side as illustrated in FIGS. 11 and 12. That is, it is ascertained from the simulation results illustrated in FIGS. 9 to 12 that the antenna switch circuit 100 according to the present embodiment can further improve characteristics of the system connected to each transmission/reception terminal in accordance with a frequency band of a signal input to or output from the transmission/reception terminal.

Implementation Example 2

(Relation of Each Parameter and Characteristic)

Figure 13:
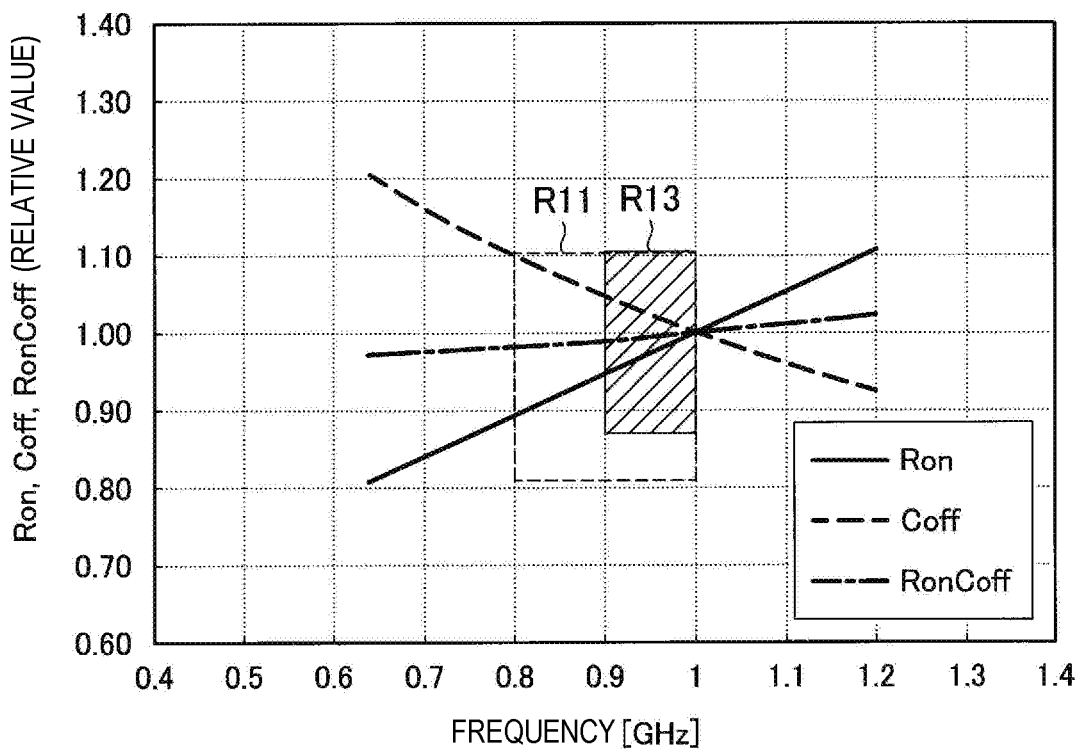
FIG. 13 illustrates an example of a simulation result of characteristics of an antenna switch circuit according to an implementation example of the present disclosure.
Figure 14:
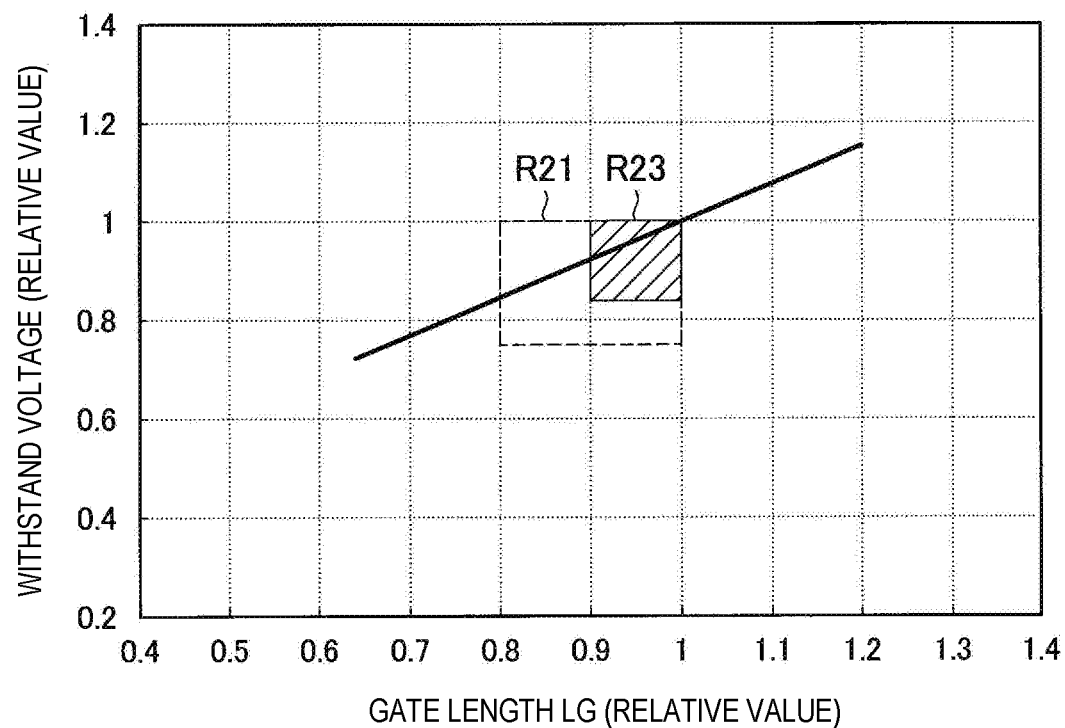
FIG. 14 illustrates an example of a simulation result of characteristics of an antenna switch circuit according to an implementation example of the present disclosure.
Figure 15:
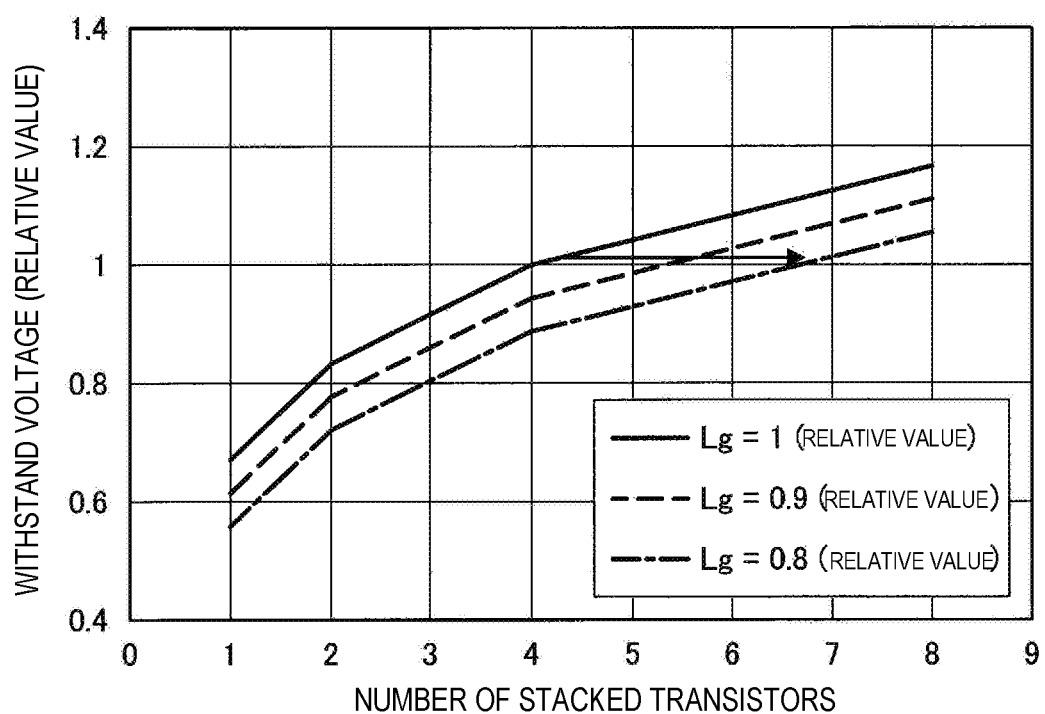
FIG. 15 illustrates an example of a simulation result of characteristics of an antenna switch circuit according to an implementation example of the present disclosure.

Next, as Implementation example 2, relations of a parameter such as a gate length Lg and the number of stacked transistors and characteristics of a system connected to each transmission/reception terminal will be described in detail with reference to FIGS. 13 to 15. FIGS. 13 to 15 illustrate examples of simulation results of characteristics of an antenna switch circuit according to the implementation example of the present disclosure.

For example, FIG. 13 illustrates an example of a simulation result of a relation between a gate length Lg of a transistor constituting a series part 101 and characteristics of the system including the series part 101. In FIG. 13, an ON-resistance Ron of the system including the series part 101, an OFF-capacitance Roll; and the product RonRoff of the ON-resistance and the OFF-capacitance are expressed as relative values as the characteristics having a case in which the gate length Lg of the transistor is a predetermined length as a reference state. That is, in the case of the gate length L2=1 (relative value), the ON-resistance Ron, the OFF-capacitance Coff, and the product RonRoff of the On-resistance and the OFF-capacitance are each set to Ron=1, Coff=1, and RonCoff-1. As illustrated in FIG. 13, as the gate length Lg becomes shorter, the ON-resistance Ron tends to becomes smaller and the OFF-capacitance Coff tends to become greater.

In addition, FIG. 14 illustrates an example of a simulation result of another relation between the gate length Lg of the transistor constituting the series part 101 and a characteristic of the system including the series part 101 in a similar configuration as the example illustrated in FIG. 13. In FIG. 14, a withstand voltage of the system including the series part 101 is expressed as relative values as the characteristic having the case in which the gate length of the transistor is a predetermined length as a reference state, similarly to the example illustrated in FIG. 13. That is, the withstand value in the case of the gate length Lg=1 (relative value) is set to 1. As illustrated in FIG. 14, as the gate length Lg becomes shorter, the withstand voltage tends to be lower.

For example, in the case of the gate length Lg=0.9, the ON-resistance Ron of the system=0.95 and the OFF-capacitance Coff=1.05 as illustrated in FIG. 13. In addition, the withstand voltage of the system at that time is about 0.91 as illustrated in FIG. 14.

In addition, in the case of the gate length Lg=0.8, the ON-resistance Ron of the system=0.9 and the OFF-capacitance Coff=1.1 as illustrated in FIG. 13. In addition, the withstand voltage of the system at that time is about 0.82 as illustrated in FIG. 14.

Note that, in FIG. 13, the ranges denoted by reference numerals R11 and R13 schematically show, for example, ranges of the characteristic of the ON-resistance Ron and the OFF-capacitance Roff necessary for the system. Likewise, in FIG. 14, the ranges denoted by reference numerals R21 and R23 schematically show ranges of the characteristic of the withstand voltage necessary for the system. Note that the range R11 of FIG. 13 corresponds to the range R21 of FIG. 14. Likewise, the range R13 of FIG. 13 corresponds to the range R23 of FIG. 14.

Next, FIG. 15 will be focused on. FIG. 15 illustrates an example of simulation results of relations between the numbers of stacked transistors in the transistor groups constituting the series part 101 and withstand voltages of the system including the series part 101. Note that, in FIG. 15, a case in which the gate length Lg of each transistor is a predetermined length and the number of stacked transistors is 4 is shown as a reference state using relative values as in the examples illustrated in FIGS. 13 and 14. In addition, in FIG. 15, the simulation results of the respective cases in which Lg=1, Lg=0.9, and Lg=0.8 are set for the gate length Lg of the transistor are shown.

As is ascertained with reference to FIG. 15, as the number of stacked transistors of a transistor group constituting the series part 101 increases, the withstand voltage of the system including the series part 101 tends to increase further. Meanwhile, as the gate length Lg of each transistor becomes shorter, the withstand tends to become lower. For these reasons, it is necessary to increase the number of stacked transistors of the transistor group in a case in which the gate length Lg of each transistor is set to be shorter in order to maintain the withstand voltage.

On the basis of the above description, the number of stacked transistors of the transistor group constituting the series part 101 and the gate length Lg of each transistor constituting the transistor group may be appropriately adjusted in accordance with the characteristics necessary for each system (i.e., a system connected to each transmission/reception terminal) in the antenna switch circuit 100 according to the present embodiment.

(Regarding Variation of Element Parameter)

Note that, in the above-described examples, the case in which the characteristics of a system is changed by adjusting the gate length Lg as an element parameter of the transistors has been focused on. Meanwhile, an element parameter to be adjusted is not limited only to the gate length Lg. As a specific example, the characteristics (e.g., the ON-resistance Ron, the OFF-capacitance Coff, and the like) of a system can be changed by also adjusting at least one of the physical distance $W_1$ between the source and the gate, the physical distance $W_2$ between the gate and the drain, the physical distance $W_3$ between the source and the drain, and the thickness $W_4$ of the gate oxide film described with reference to FIG. 5.

By further shortening the physical distance $W_1$ between the source and the gate, the physical distance $W_2$ between the gate and the drain, the physical distance $W_3$ between the source and the drain, for example, the ON-resistance Ron can be reduced. In addition, even in a case in which a thickness of the thickness $W_4$ of the gate oxide film is formed to be thinner, the ON-resistance Ron can be reduced.

By using the above-described characteristics, for example, the gate oxide film of each of the transistors constituting the series part 101 may be formed to be thinner for the system on the high frequency band side than for the system on the low frequency band side. With this configuration, it is possible to expect the same effect as in the case in which the gate length Lg of each of the transistors constituting the series part 101 of the system on the high frequency band side is adjusted to be shorter than that of the system on the low frequency band side.

As an implementation example of the antenna switch circuit 100 according to the present embodiment, the example of the technique for realizing the characteristics necessary for each of the above-described series parts 101 by adjusting the element parameter of the transistors used in the series part 101 has been described above.

<2.4. Application Example>

Next, as an application example of the antenna switch circuit 100 according to the present embodiment, an example of a configuration of a wireless communication device to which the antenna switch circuit 100 is applied will be described. For example, FIG. 16 is an explanatory diagram for describing the application example of the present embodiment, illustrating an example of a functional configuration of the wireless communication device 1 to which the antenna switch circuit 100 according to the present embodiment is applied.

Figure 16:
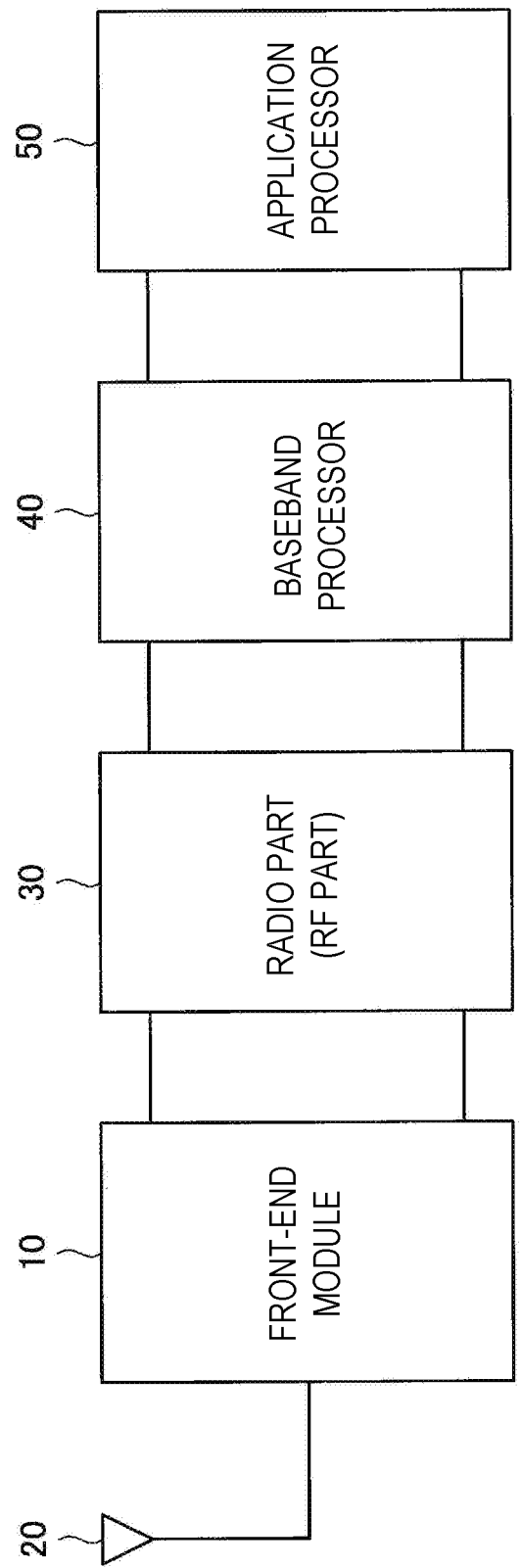
FIG. 16 is an explanatory diagram for describing an application example of the embodiment.

As illustrated in FIG. 16, the wireless communication device 1 includes a front-end module 10, an antenna element 20, a radio part (RF part) 30, a baseband processor 40, and an application processor 50.

The radio part 30 is configured to perform wireless communication with an external device (e.g., a base station) via the antenna element 20. The radio part 30 modulates a baseband signal output from the baseband processor 40 with a carrier wave of a frequency band to be used in transmission of the baseband signal. In addition, the radio part 30 causes the modulated signal (transmission signal) to be transmitted from the antenna element 20 via the front-end module 10 as a radio signal. In addition, the radio part 30 acquires a reception signal received by the antenna element 20 from an external device via the front-end module 10 and converts the acquired reception signal into a baseband signal by demodulating the signal. In addition, the radio part 30 outputs the baseband signal obtained by converting the reception signal to the baseband processor 40.

The baseband processor 40 acquires transmission data from the application processor 50 and generates a baseband signal for transmitting the acquired transmission data on the basis of wireless communication. In addition, the baseband processor 40 outputs a baseband signal generated on the basis of the transmission data to the radio part 30. In addition, the baseband processor 40 acquires a baseband signal obtained by converting a reception signal from the radio part 30. In this case, the baseband processor 40 converts the acquired baseband signal into reception data and outputs the converted reception data to the application processor 50.

Note that, since known technologies can be used as the radio part 30 and the baseband processor 40, more detailed description thereof will be omitted.

The application processor 50 is configured to execute various functions (applications). For example, the application processor 50 generates transmission data to be transmitted to external devices on the basis of execution results of the various functions and outputs the generated transmission data to the baseband processor 40. In addition, the application processor 50 may acquire reception data from the baseband processor 40 and execute a desired function on the basis of the acquired reception data.

The front-end module 10 intervenes between the antenna element 20 and the radio part 30 and selectively switches transmission and reception of signals between the antenna element 20 and the radio part 30 for each frequency band of the signals. For example, FIG. 17 is an explanatory diagram for describing the application example of the present embodiment, illustrating an example of a functional configuration of the front-end module 10 to which the antenna switch circuit 100 according to the present embodiment is applied.

Figure 17:
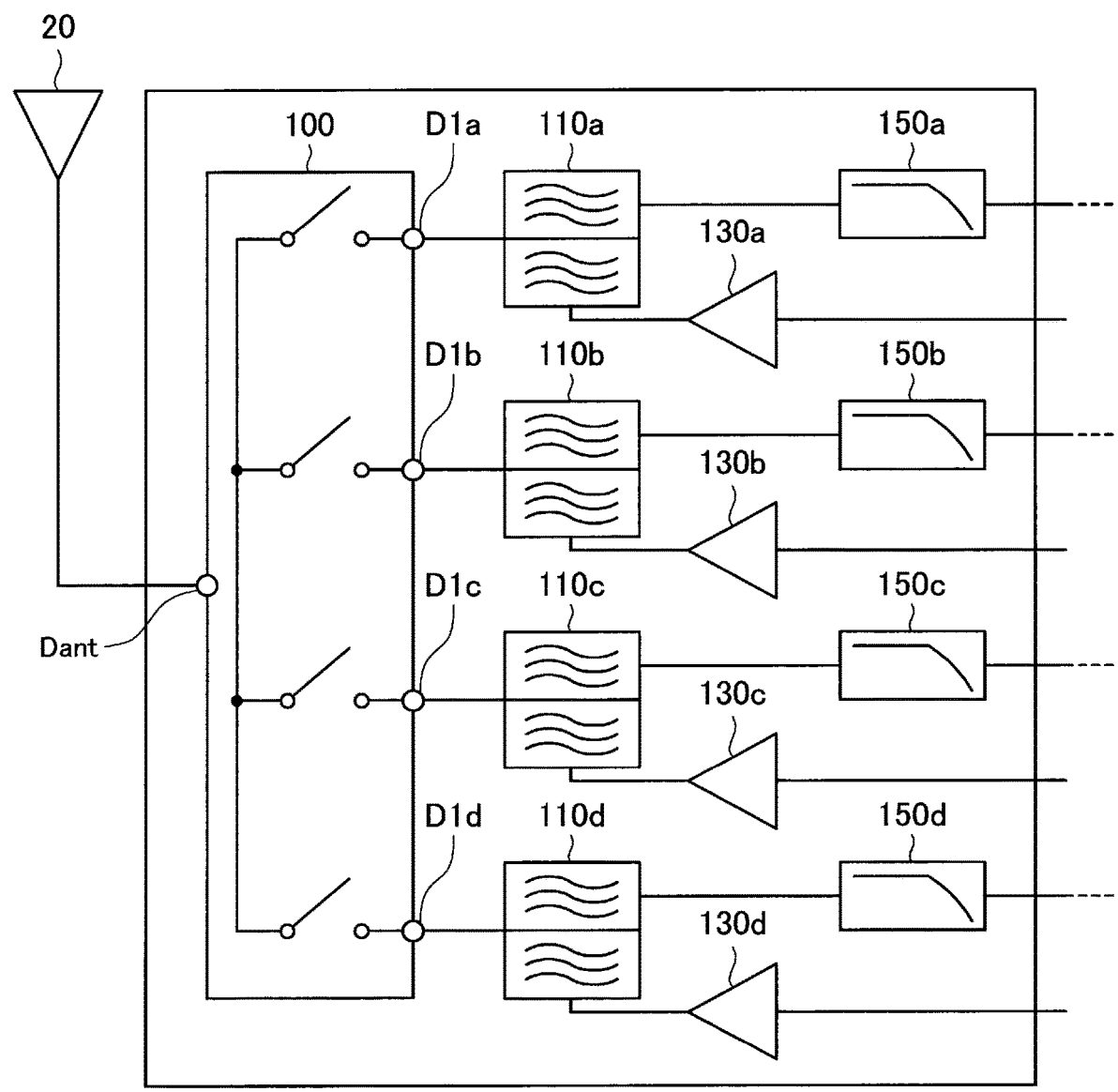
FIG. 17 is an explanatory diagram for describing an application example of the embodiment.

As illustrated in FIG. 17, the front-end module 10 includes the antenna switch circuit 100, duplexers 110a to 110d, power amplifiers 130a to 130d, and filters 150a to 150d.

The antenna switch circuit 100 of FIG. 17 corresponds to the above-described antenna switch circuit 100 according to the present embodiment. Note that, in the example illustrated in FIG. 17, it is configured such that a connection relation between an antenna terminal Dant connected to the antenna element 20 and four transmission/reception terminals D1a to D1d can be selectively switched. That is, in the example illustrated in FIG. 17, signals of different frequency bands are input to or output from each of the transmission/reception terminals D1a to D1d.

The power amplifier 130a and the filter 150a are connected to the transmission/reception terminal D1a via the duplexer 110a. More specifically, a transmission signal of a predetermined frequency band output from the radio part 30 is amplified by the power amplifier 130a and then input to the transmission/reception terminal D1a of the antenna switch circuit 100 via the duplexer 110a. In addition, a reception signal of the frequency band is input to the filter 150a from the transmission/reception terminal D1a via the duplexer 110a, and then a signal of a predetermined frequency band included in the reception signal is extracted by the filter 150a and output to the radio part 30. The duplexer 110a is configured to demultiplex a transmission signal to be input to transmission/reception terminal D1a and a reception signal to be output from the transmission/reception terminal D1a. Note that, since known technologies can be used as the duplexer 110a, the power amplifier 130a, and the filter 150a, detailed description thereof will be omitted.

Note that connection configurations of the transmission/reception terminals D1b to D1d are similar to the connection configuration of the transmission/reception terminal D1a except that frequency bands of input and output signals thereof are different. That is, the power amplifier 130b and the filter 150b are connected to the transmission/reception terminal D1b via the duplexer 110b. In addition, the power amplifier 130c and the filter 150c are connected to the transmission/reception terminal D1c via the duplexer 110c, and the power amplifier 130d and the filter 150d are connected to the transmission/reception terminal D1d via the duplexer 110d.

With the above-described configurations, the front-end module 10 can selectively switch transmission and reception of signals between the antenna element 20 and the radio part 30 for each frequency band of the signals. Note that the front-end module 10 is an example of a "module device."

The example of the configuration of the wireless communication device to which the antenna switch circuit 100 is applied has been described above with reference to FIGS. 16 and 17 as the application example of the antenna switch circuit 100 according to the present embodiment. Note that two or more configurations of at least some of the front-end module 10, the antenna element 20, the radio part (RF part) 30, the baseband processor 40, and the application processor 50 illustrated in FIG. 17 may be configured as one chip.

<<3. Conclusion>>

The semiconductor device constituting the antenna switch circuit 100 according to the present embodiment includes the plurality of transmission/reception terminals and the series parts each provided for the transmission/reception terminals as described above. In addition, the series parts are configured to be connected to the plurality of transistors in series. With this configuration, in the semiconductor device, the series parts (i.e., transistor groups) connected to each of the transmission/reception terminals have different ON-resistances and receive inputs of signals having different power levels.

With the above-described configuration, the antenna switch circuit 100 according to the present embodiment can support multiple bands and can realize device characteristics (e.g., "insertion loss") necessary for transmission and reception of a signal of each frequency band for each of frequency bands in a more favorable manner. Accordingly, high performance of a front-end module to which the antenna switch circuit 100 is applied and a wireless communication device to which the front-end module is applied can be achieved.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A semiconductor device including:

a plurality of terminals; and a plurality of transistor groups provided for each of the terminals, in which a plurality of transistors are connected in series in each group, in which the plurality of transistor groups have different ON-resistances from each other and receive inputs of signals having different power levels from each other.

(2)

The semiconductor device according to (1), in which, among the plurality of transistor groups, a first transistor group has a higher ON-resistance than a second transistor group which receives an input of a signal having a lower power level than a signal input to the first transistor group.

(3)

The semiconductor device according to (2), in which the second transistor group has a higher withstand voltage than the first transistor group.

(4)

The semiconductor device according to (2) or (3), in which a first transistor constituting the first transistor group and a second transistor constituting the second transistor group differ in at least one element parameter among a gate length, a physical distance between a source and a gate, a physical distance between a gate and a drain, a physical distance between a source and a drain, and a thickness of a gate oxide film.

(5)

The semiconductor device according to (4), in which the element parameters differ between the first transistor and the second transistor in accordance with a difference in ON-resistances between the first transistor group and the second transistor group.

(6)

The semiconductor device according to (4) or (5), in which the first transistor group and the second transistor group have different withstand voltages from each other, and the element parameters differ between the first transistor and the second transistor in accordance with a difference in withstand voltages between the first transistor group and the second transistor group.

(7)

The semiconductor device according to any one of (1) to (6), including:
a second terminal different from, a plurality of first terminals which are the plurality of terminals,
in which control is performed such that a connection relation between the second terminal and each of the plurality of first terminals is selectively in a conduction state by performing control such that the transistor groups connected to each of the plurality of first terminals are selectively in the conduction state.

(8)

The semiconductor device according to any one of (1) to (7), in which the plurality of terminals and the plurality of transistor groups are formed on an SOI substrate.

(9)

The semiconductor device according to any one of (1) to (7), in which the plurality of terminals and the plurality of transistor groups are formed on a semi-insulating substrate.

(10)

An antenna switch circuit including:
an antenna terminal configured to be connected to an antenna;
a plurality of transmission/reception terminals different from the antenna terminal; and
a plurality of transistor groups provided for each of the transmission/reception terminals, in which a plurality of transistors are connected in series in each group,
in which the plurality of transistor groups have different ON-resistances from each other and receive inputs of signals having different power levels from each other, and
control is performed such that a connection relation between the antenna terminal and each of the plurality of transmission/reception terminals is selectively in a conduction state by performing control such that the transistor groups connected to each of the plurality of transmission/reception terminals are selectively in the conduction state.

(11)

A module device including:
an antenna switch circuit that includes an antenna terminal configured to be connected to an antenna and a plurality of transmission/reception terminals which are different from the antenna terminal, and is configured to selectively switch a connection relation between the antenna terminal and each of the plurality of transmission/reception ends; and
a duplexer configured to be connected to each of the plurality of transmission/reception terminals and demultiplex a transmission signal input to the transmission/reception terminal and a reception signal output from the transmission/reception terminal,
in which the antenna switch circuit includes a plurality of transistor groups which are provided for each of the transmission/reception terminals, in which a plurality of transistors are connected in series in each group,
the plurality of transistor groups have different ON-resistances from each other and receive inputs of signals having different power levels from each other, and
control is performed such that a connection relation between the antenna terminal and each of the plurality of transmission/reception terminals is selectively in a conduction state by performing control such that the transistor groups connected to each of the plurality of transmission/reception terminals are selectively in the conduction state.

(12)

A wireless communication device including:
an antenna: and
a front-end module configured to selectively switch an input of a transmission signal to the antenna and an output of a reception signal received by the antenna for each frequency,
in which the front-end module includes
an antenna switch circuit that includes an antenna terminal configured to be connected to the antenna and a plurality of transmission/reception terminals which are different from the antenna terminal, and is configured to selectively switch a connection relation between the antenna terminal and each of the plurality of transmission/reception ends, and
a duplexer configured to be connected to each of the plurality of transmission/reception terminals and demultiplex the transmission signal input to the transmission/reception terminal and the reception signal output from the transmission/reception terminal,
the antenna switch circuit includes a plurality of transistor groups which are provided for each of the transmission/reception terminals, in which a plurality of transistors are connected in series in each group,
the plurality of transistor groups have different ON-resistances from each other and receive inputs of signals having different power levels from each other, and
control is performed such that a connection relation between the antenna terminal and each of the plurality of transmission/reception terminals is selectively in a conduction state by performing control such that the transistor groups connected to each of the plurality of transmission/reception terminals are selectively in the conduction state.

REFERENCE SIGNS LIST 1 wireless communication device
10 front-end module
100 antenna switch circuit
101 series part
103 shunt part
110a to 110d duplexer
130a to 130d power amplifier
150a to 150d filter
20 antenna element
30 radio part (RF part)
40 baseband processor
50 application processor

What is claimed is:
1. A semiconductor device, comprising:
a plurality of terminals; and
a plurality of transistor groups provided for each of the terminals, in which a plurality of transistors are connected in series in each group,
wherein the plurality of transistor groups have different ON-resistances from each other and receive inputs of signals having different power levels from each other, and wherein, among the plurality of transistor groups, a first transistor group has a higher ON-resistance than a second transistor group which receives an input of a signal having a lower power level than a signal input to the first transistor group.

2. The semiconductor device according to claim 1, wherein the second transistor group has a higher withstand voltage than the first transistor group.

3. The semiconductor device according to claim 2, wherein a first transistor constituting the first transistor group and a second transistor constituting the second transistor group differ in at least one element parameter among a gate length, a physical distance between a source and a gate, a physical distance between a gate and a drain, a physical distance between a source and a drain, and a thickness of a gate oxide film.

4. The semiconductor device according to claim 2, comprising:
a second terminal different from a plurality of first terminals which are the plurality of terminals,
wherein control is performed such that a connection relation between the second terminal and each of the plurality of first terminals is selectively in a conduction state by performing control such that the transistor groups connected to each of the plurality of first terminals are selectively in the conduction state.

5. The semiconductor device according to claim 2, wherein the plurality of terminals and the plurality of transistor groups are formed on an SOI substrate.

6. The semiconductor device according to claim 2, wherein the plurality of terminals and the plurality of transistor groups are formed on a semi-insulating substrate.

7. The semiconductor device according to claim 1, wherein a first transistor constituting the first transistor group and a second transistor constituting the second transistor group differ in at least one element parameter among a gate length, a physical distance between a source and a gate, a physical distance between a gate and a drain, a physical distance between a source and a drain, and a thickness of a gate oxide film.

8. The semiconductor device according to claim 7, wherein the element parameters differ between the first transistor and the second transistor in accordance with a difference in ON-resistances between the first transistor group and the second transistor group.

9. The semiconductor device according to claim 8, wherein the first transistor group and the second transistor group have different withstand voltages from each other, and the element parameters differ between the first transistor and the second transistor in accordance with a difference in withstand voltages between the first transistor group and the second transistor group.

10. The semiconductor device according to claim 8, comprising:
a second terminal different from a plurality of first terminals which are the plurality of terminals,
wherein control is performed such that a connection relation between the second terminal and each of the plurality of first terminals is selectively in a conduction state by performing control such that the transistor groups connected to each of the plurality of first terminals are selectively in the conduction state.

11. The semiconductor device according to claim 7, wherein the first transistor group and the second transistor group have different withstand voltages from each other, and the element parameters differ between the first transistor and the second transistor in accordance with a difference in withstand voltages between the first transistor group and the second transistor group.

12. The semiconductor device according to claim 7, comprising:
a second terminal different from a plurality of first terminals which are the plurality of terminals,
wherein control is performed such that a connection relation between the second terminal and each of the plurality of first terminals is selectively in a conduction state by performing control such that the transistor groups connected to each of the plurality of first terminals are selectively in the conduction state.

13. The semiconductor device according to claim 7, wherein the plurality of terminals and the plurality of transistor groups are formed on an SOI substrate.

14. The semiconductor device according to claim 7, wherein the plurality of terminals and the plurality of transistor groups are formed on a semi-insulating substrate.

15. The semiconductor device according to claim 1, comprising:
a second terminal different from a plurality of first terminals which are the plurality of terminals,
wherein control is performed such that a connection relation between the second terminal and each of the plurality of first terminals is selectively in a conduction state by performing control such that the transistor groups connected to each of the plurality of first terminals are selectively in the conduction state.

16. The semiconductor device according to claim 1, wherein the plurality of terminals and the plurality of transistor groups are formed on an SOI substrate.

17. The semiconductor device according to claim 1, wherein the plurality of terminals and the plurality of transistor groups are formed on a semi-insulating substrate.

18. An antenna switch circuit, comprising:
an antenna terminal configured to be connected to an antenna;
a plurality of transmission/reception terminals different from the antenna terminal; and
a plurality of transistor groups provided for each of the transmission/reception terminals, in which a plurality of transistors are connected in series in each group,
wherein the plurality of transistor groups have different ON-resistances from each other and receive inputs of signals having different power levels from each other, and
control is performed such that a connection relation between the antenna terminal and each of the plurality of transmission/reception terminals is selectively in a conduction state by performing control such that the transistor groups connected to each of the plurality of transmission/reception terminals are selectively in the conduction state.

19. A module device comprising:
an antenna switch circuit that includes an antenna terminal configured to be connected to an antenna and a plurality of transmission/reception terminals which are different from the antenna terminal, and is configured to selectively switch a connection relation between the antenna terminal and each of the plurality of transmission/reception terminals; and
a plurality of duplexers, wherein a duplexer is connected to each of the plurality of transmission/reception terminals, wherein each duplexer is configured to demultiplex a transmission signal input to a connected transmission/reception terminals and a reception signal output from the connected transmission/reception terminals, wherein the antenna switch circuit includes a plurality of transistor groups which are provided for each of the transmission/reception terminals, in which a plurality of transistors are connected in series in each group, the plurality of transistor groups have different ON-resistances from each other and receive inputs of signals having different power levels from each other, and control is performed such that a connection relation between the antenna terminal and each of the plurality of transmission/reception terminals is selectively in a conduction state by performing control such that the transistor groups connected to each of the plurality of transmission/reception terminals are selectively in the conduction state.

20. A wireless communication device, comprising:

an antenna; and a front-end module configured to selectively switch an input of a transmission signal to the antenna and an output of a reception signal received by the antenna for each frequency, wherein the front-end module includes:

an antenna switch circuit that includes an antenna terminal configured to be connected to the antenna and a plurality of transmission/reception terminals which are different from the antenna terminal, and is configured to selectively switch a connection relation between the antenna terminal and each of the plurality of transmission/reception terminals, and a plurality of duplexers, wherein a duplexer is connected to each of the plurality of transmission/reception terminals, wherein each duplexer is configured to demultiplex the transmission signal input to a connected transmission/reception terminal and the reception signal output from the connected transmission/reception terminal, the antenna switch circuit includes a plurality of transistor groups which are provided for each of the transmission/reception terminals, in which a plurality of transistors are connected in series in each group, the plurality of transistor groups have different ON-resistances from each other and receive inputs of signals having different power levels from each other, and control is performed such that a connection relation between the antenna terminal and each of the plurality of transmission/reception terminals is selectively in a conduction state by performing control such that the transistor groups connected to each of the plurality of transmission/reception terminals are selectively in the conduction state.

* * * * *